US012696809B2

(12) United States Patent

Nishizawa

(10) Patent No.: US 12,696,809 B2

(45) Date of Patent: Jul. 28, 2026

(54) METHOD FOR MANUFACTURING SEMICONDUCTOR MODULE

(71) Applicant: FUJI ELECTRIC CO., LTD., Kawasaki (JP)

(72) Inventor: Tatsuo Nishizawa, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 378 days.

(21) Appl. No.: 18/216,144

(22) Filed: Jun. 29, 2023

(65) Prior Publication Data

US 2024/0055391 A1 Feb. 15, 2024

(30) Foreign Application Priority Data

Aug. 9, 2022 (JP) ................................. 2022-127031

(51) Int. Cl.
*H10W 90/00* (2026.01)
*H10W 72/00* (2026.01)
*H10W 72/30* (2026.01)

(52) U.S. Cl.
CPC ...... *H10W 90/00* (2026.01); *H10W 72/07331* (2026.01); *H10W 72/07355* (2026.01);
(Continued)

(58) Field of Classification Search
CPC ......... H01L 24/29; H01L 24/83; H01L 24/32; H01L 24/33; H01L 23/3735; H01L 24/27; H01L 23/49833; H01L 24/45; H01L 23/14; H01L 23/48; H01L 23/3107; H01L 23/562; H01L 24/48; H01L 23/49811;

H01L 23/5385; H01L 23/3142; H01L 24/92; H01L 24/49; H01L 24/85; H01L 25/0655; H01L 24/73; H01L 25/50; H01L 25/072; H01L 23/49575; H01L 25/18; H01L 23/49562; H01L 23/49531; H01L 23/49844; H01L 2224/8384;
(Continued)

(56) References Cited

U.S. PATENT DOCUMENTS 5,793,106 A * 8/1998 Yasukawa ........... H01L 23/3121
257/713
8,598,458 B2 12/2013 Ishino et al.
(Continued)

FOREIGN PATENT DOCUMENTS

| JP | 2013-125769 A | 6/2013 |
| JP | 2014-135411 A | 7/2014 |
| JP | 2015-115481 A | 6/2015 |

*Primary Examiner* — Mouloucoulaye Inoussa

(57) ABSTRACT

A method for manufacturing a semiconductor module can prevent performance and reliability degradation of a semiconductor module. The method for manufacturing a semiconductor module includes: arranging an insulating wiring board on a low die; arranging a sintering material at plural locations on the insulating wiring board and arranging a semiconductor chip on each of the plural sintering materials; arranging a structure above protruding portions of the sintering materials protruding from a periphery of each of the plural semiconductor chips; and sintering by pressurizing and heating the plural sintering materials by an upper die through the structure at the protruding portions and through the semiconductor chips at contacting portions in contact with lower surfaces of the semiconductor chips.

21 Claims, 13 Drawing Sheets

(52) U.S. Cl.
CPC .... *H10W 72/07554* (2026.01); *H10W 72/351* (2026.01); *H10W 72/884* (2026.01); *H10W 90/736* (2026.01)

(58) Field of Classification Search
CPC ... H01L 2224/29139; H01L 2224/2711; H01L 2224/33181; H01L 2224/32225; H01L 2224/83447; H01L 2224/3303; H01L 2224/83192; H01L 2224/83191; H01L 2224/27438; H01L 2224/83201; H01L 2924/10272; H01L 2224/73215; H01L 2224/2612; H01L 2224/48175; H01L 2224/73265; H05K 7/209; H02M 7/003
See application file for complete search history.

(56) References Cited

U.S. PATENT DOCUMENTS

| | | | | |
|---|---|---|---|---|
| 8,835,299 | B2 | 9/2014 | Speckels et al. | |
| 11,380,647 | B2 | 7/2022 | Schivalocchi | |
| 2008/0230905 | A1* | 9/2008 | Guth | H01L 24/49 |
| | | | | 438/653 |
| 2010/0127371 | A1* | 5/2010 | Tschirbs | H05K 1/142 |
| | | | | 257/E23.083 |
| 2010/0302741 | A1* | 12/2010 | Kanschat | H01L 25/072 |
| | | | | 361/728 |
| 2014/0264383 | A1 | 9/2014 | Kajiwara et al. | |
| 2015/0171054 | A1 | 6/2015 | Yamayose et al. | |
| 2015/0303126 | A1* | 10/2015 | Takahashi | H01L 23/49894 |
| | | | | 257/77 |
| 2017/0137939 | A1* | 5/2017 | Creyghton | H01J 37/32568 |
| 2017/0338176 | A1* | 11/2017 | Tsuyuno | H01L 23/49838 |
| 2019/0326250 | A1 | 10/2019 | Schivalocchi | |
| 2020/0286865 | A1* | 9/2020 | Chew | H01L 24/84 |
| 2021/0057372 | A1* | 2/2021 | Oh | H01L 25/50 |
| 2021/0170708 | A1 | 6/2021 | Schivalocchi | |
| 2021/0242156 | A1* | 8/2021 | Kato | H01L 23/367 |
| 2021/0296190 | A1* | 9/2021 | Nakamata | H01L 23/3735 |
| 2021/0400838 | A1* | 12/2021 | Nottelmann | H05K 3/303 |
| 2021/0407954 | A1* | 12/2021 | Yoshihara | H01L 23/373 |
| 2023/0187403 | A1* | 6/2023 | Hong | H01L 24/32 |
| | | | | 257/773 |
| 2023/0369181 | A1* | 11/2023 | Scharf | H01L 24/32 |
| 2024/0079372 | A1* | 3/2024 | Omae | H01L 24/49 |
| 2024/0404981 | A1* | 12/2024 | Yoshikawa | H01L 24/45 |

* cited by examiner

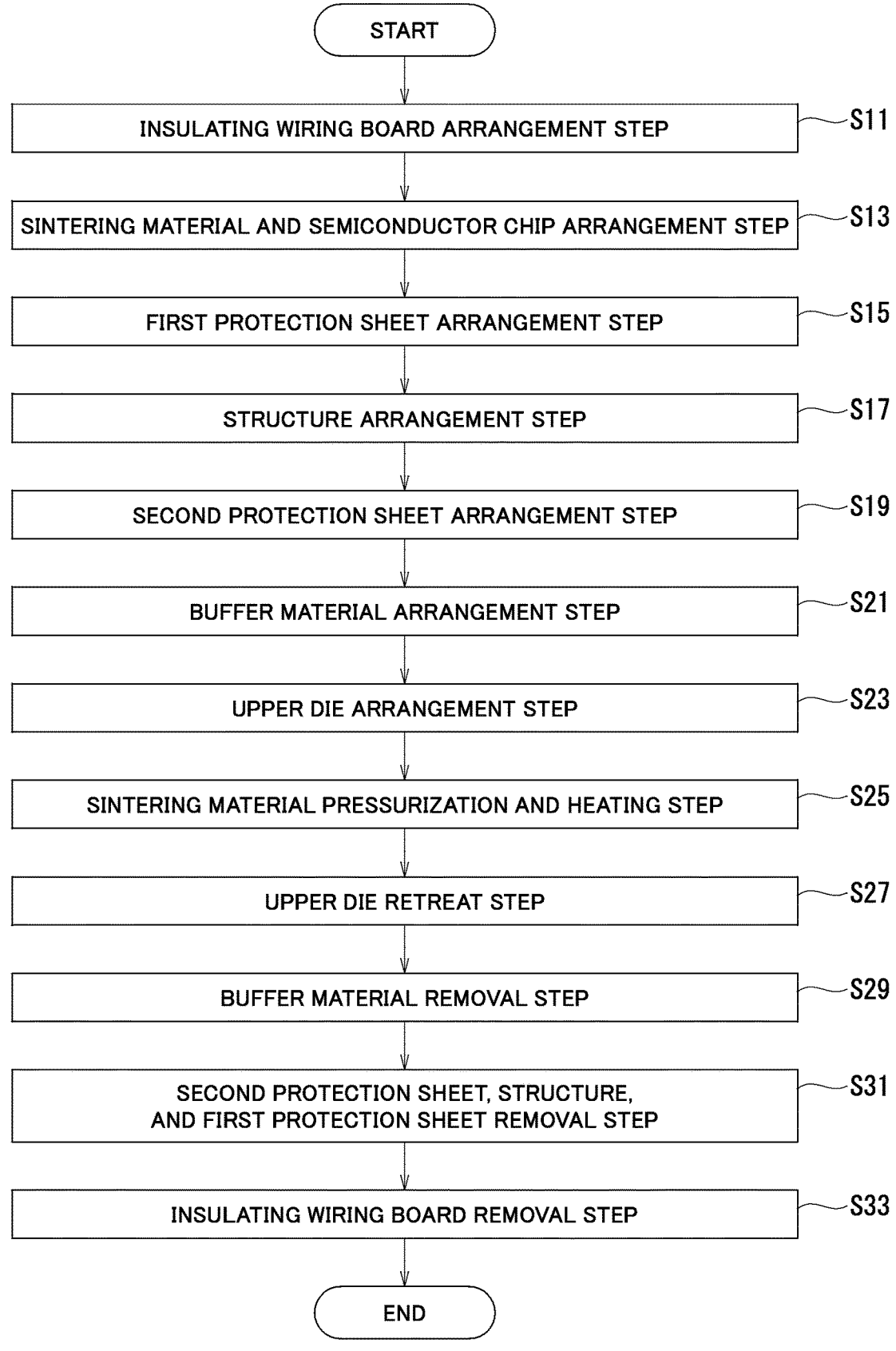

START

INSULATING WIRING BOARD ARRANGEMENT STEP — S11

SINTERING MATERIAL AND SEMICONDUCTOR CHIP ARRANGEMENT STEP — S13

FIRST PROTECTION SHEET ARRANGEMENT STEP — S15

STRUCTURE ARRANGEMENT STEP — S17

SECOND PROTECTION SHEET ARRANGEMENT STEP — S19

BUFFER MATERIAL ARRANGEMENT STEP — S21

UPPER DIE ARRANGEMENT STEP — S23

SINTERING MATERIAL PRESSURIZATION AND HEATING STEP — S25

UPPER DIE RETREAT STEP — S27

BUFFER MATERIAL REMOVAL STEP — S29

SECOND PROTECTION SHEET, STRUCTURE, AND FIRST PROTECTION SHEET REMOVAL STEP — S31

INSULATING WIRING BOARD REMOVAL STEP — S33

END

FIG. 3
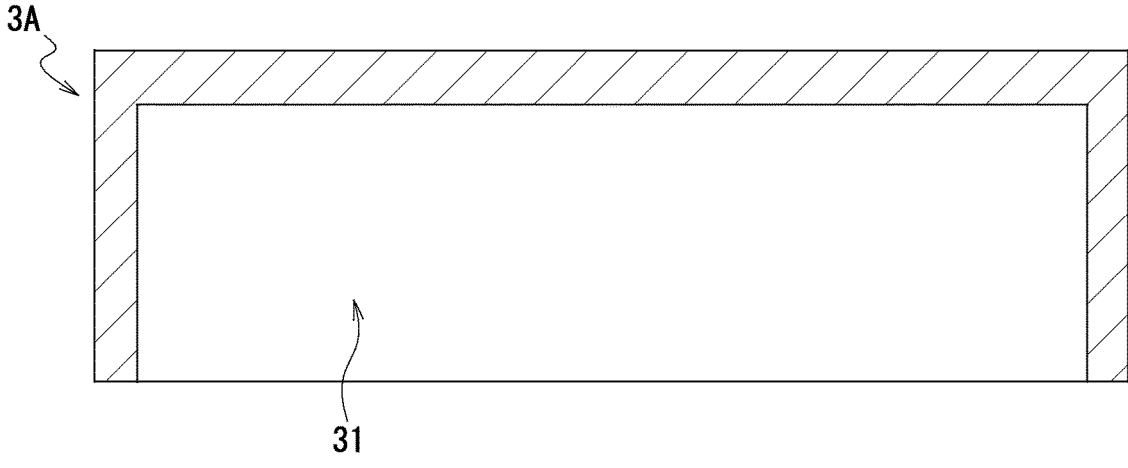
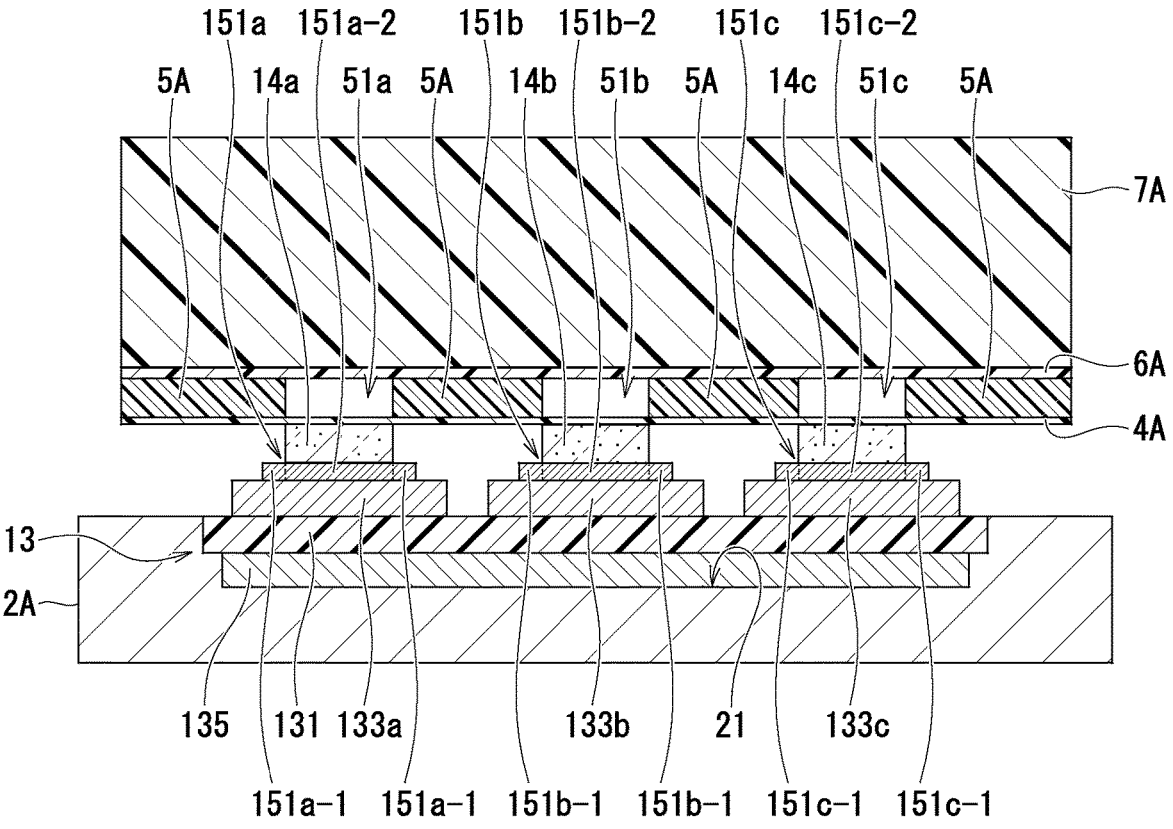

FIG. 5
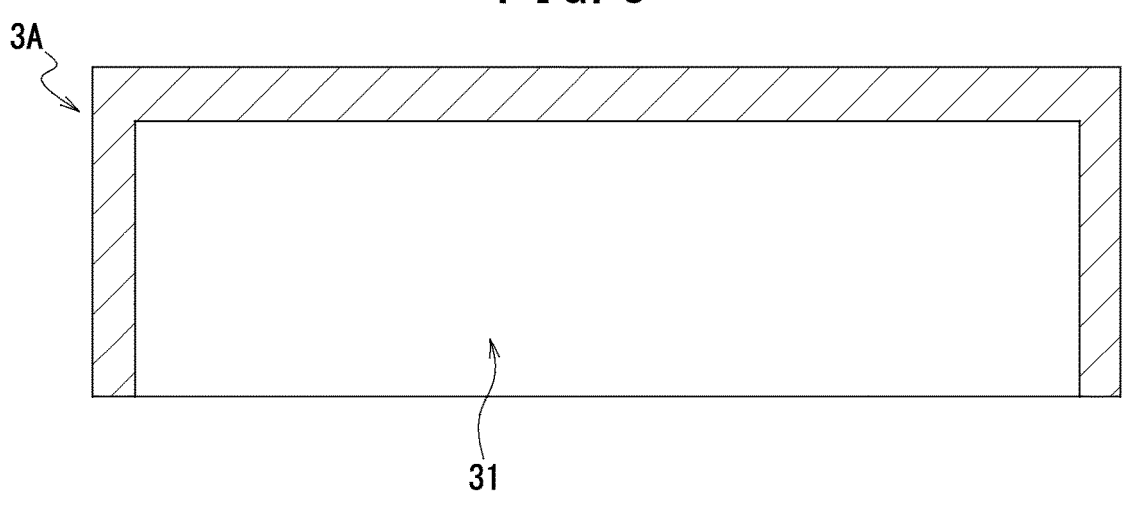
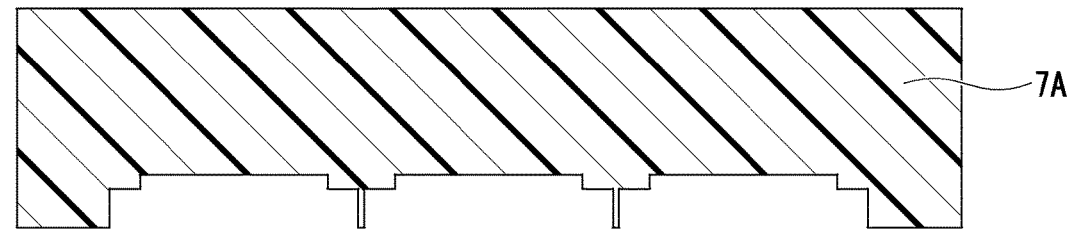
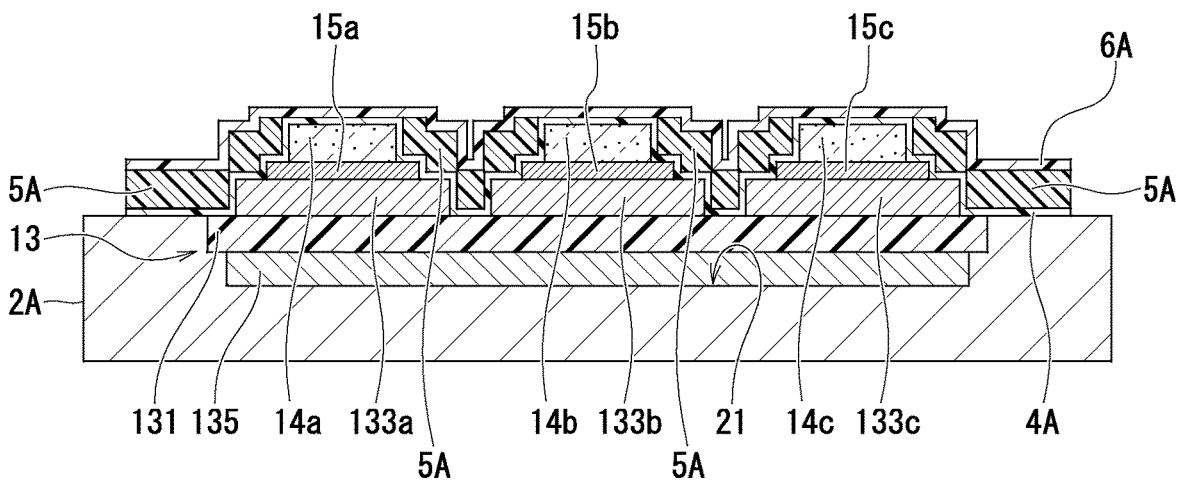

9B

94

95

141a 152a    141b 152b    141c 152c

13X

2Y 136    132    134a    134b    134c

9B 141a 152a    141b 152b    141c 152c

94

95

13X

2Y 136    132    134a    134b    134c

FIG. 12
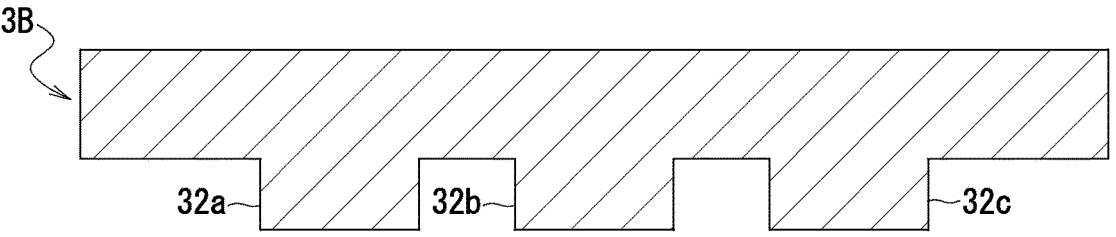
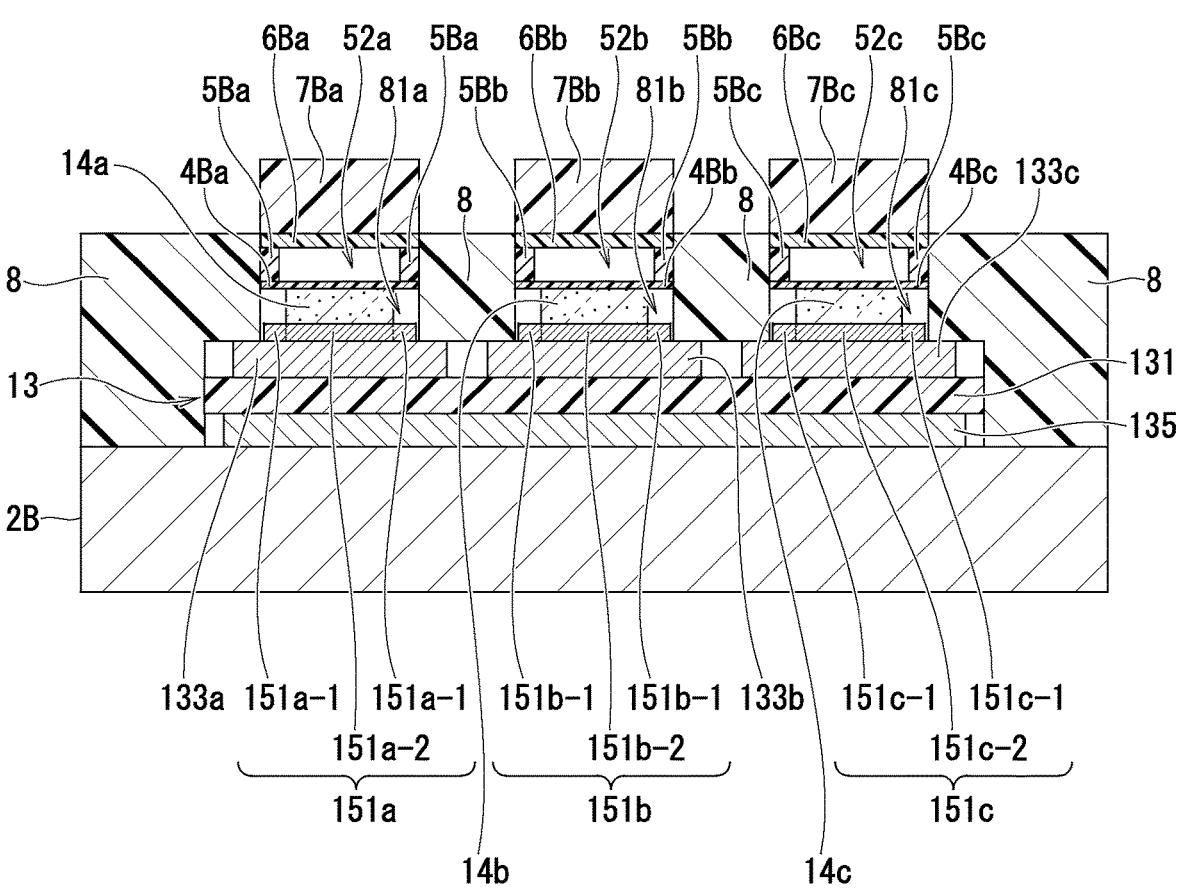

METHOD FOR MANUFACTURING SEMICONDUCTOR MODULE

CROSS-REFERENCE TO RELATED APPLICATION

This application claims benefit of priority under 35 USC 119 based on Japanese Patent Application No. 2022-127031 filed on Aug. 9, 2022, the entire contents of which are incorporated by reference herein.

TECHNICAL FIELD

The present invention relates to a method for manufacturing a semiconductor module including one or more semiconductor chips.

BACKGROUND ART

In the field of power semiconductor technology, solder is used to bond semiconductor chips to an insulating substrate. In recent years, in order to use silicon carbide (SiC) semiconductor chips, sintering materials having high thermal conductivity and high durability have been used to bond SiC semiconductor chips to an insulating substrate.

Sintering materials have two forms: paste and sheet. Both forms require pressurization and heating on a portion to be bonded during sintering bonding by means of sintering material. A plurality of semiconductor chips is placed on a sintering material formed on or above an insulating substrate, and heat is applied while pressing and pressurizing upper surfaces of the semiconductor chips to cause a sintering reaction in the sintering material. This bonds the semiconductor chips to the insulating substrate.

Patent Document 1 discloses that "a member to be bonded in which a heat dissipation base, an insulating circuit board, and semiconductor chips are stacked together is arranged in a pressure vessel, then, a spherical powder layer is densely filled around the member to be bonded, and pressurized by a pressurizing plate from a top to a bottom of the pressure vessel, by which the member to be bonded is also pressurized, as well as heated by a heating mechanism provided at a lower part of the pressure vessel, resulting in bonding of each semiconductor chip to a wiring layer of the insulating circuit board by means of sintered metal layer".

Patent Document 2 discloses that "an upper die is arranged on an upper jig provided with an elastic member and a pressure block in an opening portion thereof, and a buffer layer is arranged under the upper jig, and semiconductor chips are mounted on an insulating circuit board through a sintering material, in which the elastic member is set so as to cover the semiconductor chips and the insulating circuit board".

Patent Document 3 discloses that "semiconductor chips are disposed on an insulating circuit board through a sintering material, a pressing portions are disposed above the semiconductor chips, a frame material is disposed around and between the semiconductor chips, and a buffer layer is arranged between the pressing portions and the semiconductor chips so as to cover the semiconductor chips and the frame material, in which the semiconductor chips are pressurized by the pressing portions through the buffer layer".

Patent Document 4 discloses that "electronic components are pressed by pressing stems through an actuating flat gasket". Patent Document 5 discloses that electronic components are pressed by presser rods through a sealing membrane". Patent Document 6 discloses that a sintering material arranged is larger than a semiconductor chip (semiconductor die)".

Patent Document 7 discloses that "a semiconductor device comprises a die pad, a SiC chip mounted on the die pad, a first sintered Ag layer that is porous and that bonds the die pad and the SiC chip together, and a reinforcing resin portion that covers a surface of the first sintered Ag layer and is formed into a fillet shape. The semiconductor device further comprises a source lead that is electrically connected to a source electrode of the SiC chip, a drain lead that is electrically connected to a drain lead, and a sealing body that covers the SiC chip, the first sintered Ag layer, and a part of the die pad. The reinforcing resin portion covers a part of a side surface of the SiC chip".

Patent Document 8 discloses that "pores of a metal conductor are impregnated with a reinforcing resin, such as polyimide, which mechanically reinforces the metal conductor, from an end face side of the metal conductor toward an inside thereof".

CITATION LIST

Patent Literature

Patent Document 1: JP 2021-027288 A
Patent Document 2: JP 2021-150548 A
Patent Document 3: JP 2021-197447 A
Patent Document 4: WO 2020/008287
Patent Document 5: WO 2018/122795
Patent Document 6: U.S. Pat. No. 8,835,299
Patent Document 7: JP 2014-179541 A
Patent Document 8: JP 2011-165871 A

SUMMARY OF INVENTION

Technical Problem

When a semiconductor chip is bonded to an insulating circuit board together by using a sintering material, the sintering material is formed one size larger than the semiconductor chip to increase an area where the semiconductor chip contacts the sintering material. Therefore, the sintering material has a portion protruding from a periphery of the semiconductor chip.

In the conventional methods for sintering a sintering material, pressure is applied to the sintering material through the semiconductor chip. Therefore, while a portion of the sintering material that is located under the semiconductor chip can be pressurized as desired, a portion of the sintering material protruding from the periphery of the semiconductor chip cannot be pressurized as desired. A sintered metal layer formed by sintering the sintering material has desired density at the portion located under the semiconductor chip, but does not have any desired density at the portion protruding from the periphery of the semiconductor chip. As a result, in the sintered metal layer, no desired electrical characteristics, thermal characteristics, mechanical characteristics, and the like can be obtained at the protruding portion, due to which the deteriorated mechanical characteristics may cause the protruding portion to become a starting point of a crack. When a crack occurs in the sintered metal layer, electrical characteristics and thermal characteristics become uneven at a portion where the semiconductor chip and the insulating circuit board are bonded. This results in performance and reliability degradation of a semiconductor module including the semiconductor chip and the insulating circuit board.

It is an object of the present invention to provide a method for manufacturing a semiconductor module that can prevent performance and reliability degradation of a semiconductor module.

Solution to Problem

To achieve the object, a method for manufacturing a semiconductor module according to one aspect of the present invention includes: arranging an insulating wiring board on a lower die; arranging a sintering material at a plurality of locations on the insulating wiring board and arranging a semiconductor chip on each of the plurality of sintering materials; arranging a structure above protruding portions of the sintering materials protruding from a periphery of each of the plurality of semiconductor chips; and sintering by pressurizing and heating the plurality of sintering materials by means of an upper die through the structure at the protruding portions of the sintering materials and through the semiconductor chips at portions of the sintering materials under the semiconductor chips.

Advantageous Effects of Invention

According to the one aspect of the present invention, performance and reliability degradation of a semiconductor module can be prevented.

BRIEF DESCRIPTION OF DRAWINGS

FIG. 1 is a cross-sectional schematic diagram illustrating an example of a schematic configuration of a semiconductor module manufactured by a method for manufacturing a semiconductor module according to Embodiment 1 of the present invention.

FIG. 2 is a flowchart illustrating an example of a flow of the method for manufacturing a semiconductor module according to Embodiment 1 of the present invention.

FIG. 3 is a diagram schematically illustrating a structure arrangement step in the method for manufacturing a semiconductor module according to Embodiment 1 of the present invention.

FIG. 5 is a diagram schematically illustrating a buffer material removal step and an upper die retreat step in method for manufacturing a semiconductor module according to Embodiment 1 of the present invention.

FIG. 12 is a diagram schematically illustrating a structure arrangement step in a method for manufacturing a semiconductor module according to Embodiment 2 of the present invention.

DESCRIPTION OF EMBODIMENTS

Figure 4:
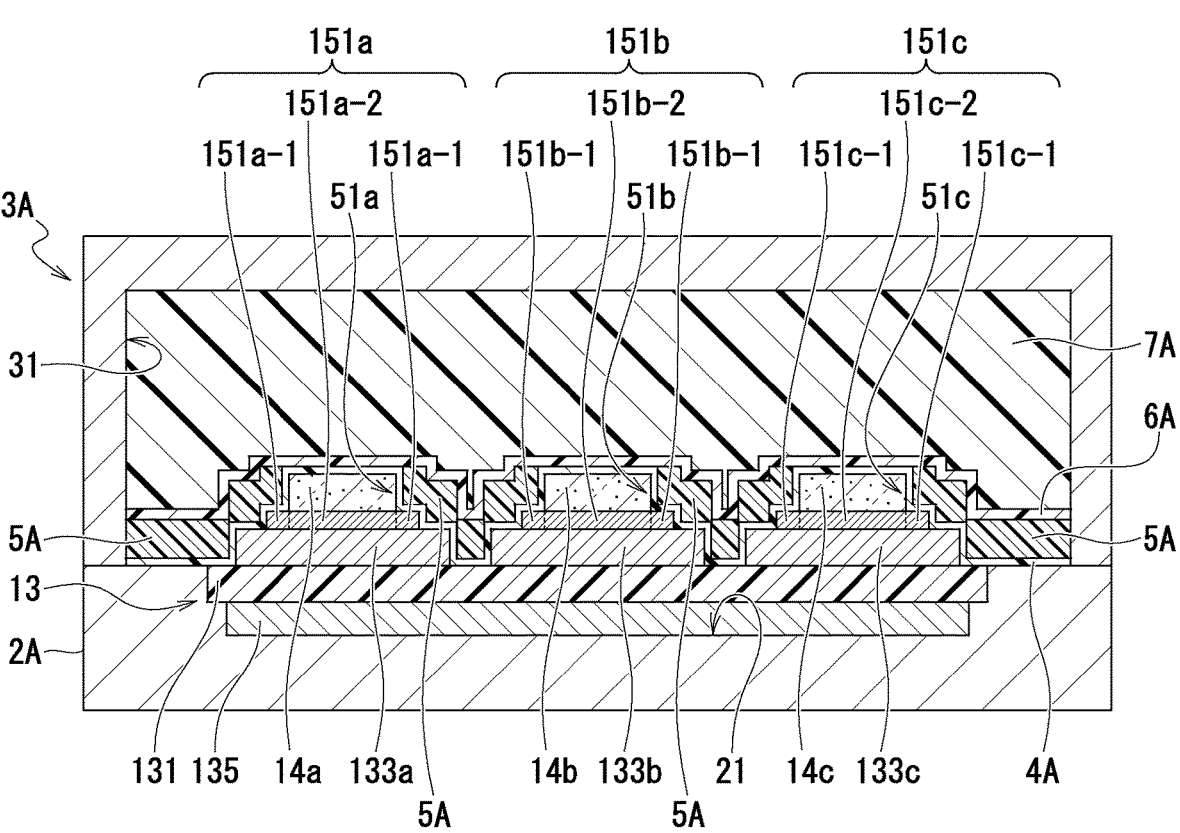
FIG. 4 is a diagram schematically illustrating a sintering material pressurization and heating step in the method for manufacturing a semiconductor module according to Embodiment 1 of the present invention.

Each embodiment of the present invention exemplifies devices and methods for embodying the technological idea of the present invention, and the technological idea of the present invention does not specify the materials, shapes, structures, arrangements, and the like of components to those described below. The technological idea of the present invention can be modified in various ways within the technological scope defined by the appended claims.

Embodiment 1

A method for manufacturing a semiconductor module according to Embodiment 1 of the present invention is described using FIGS. 1 to 11.

(Configuration of Semiconductor Module)

Figure 1:
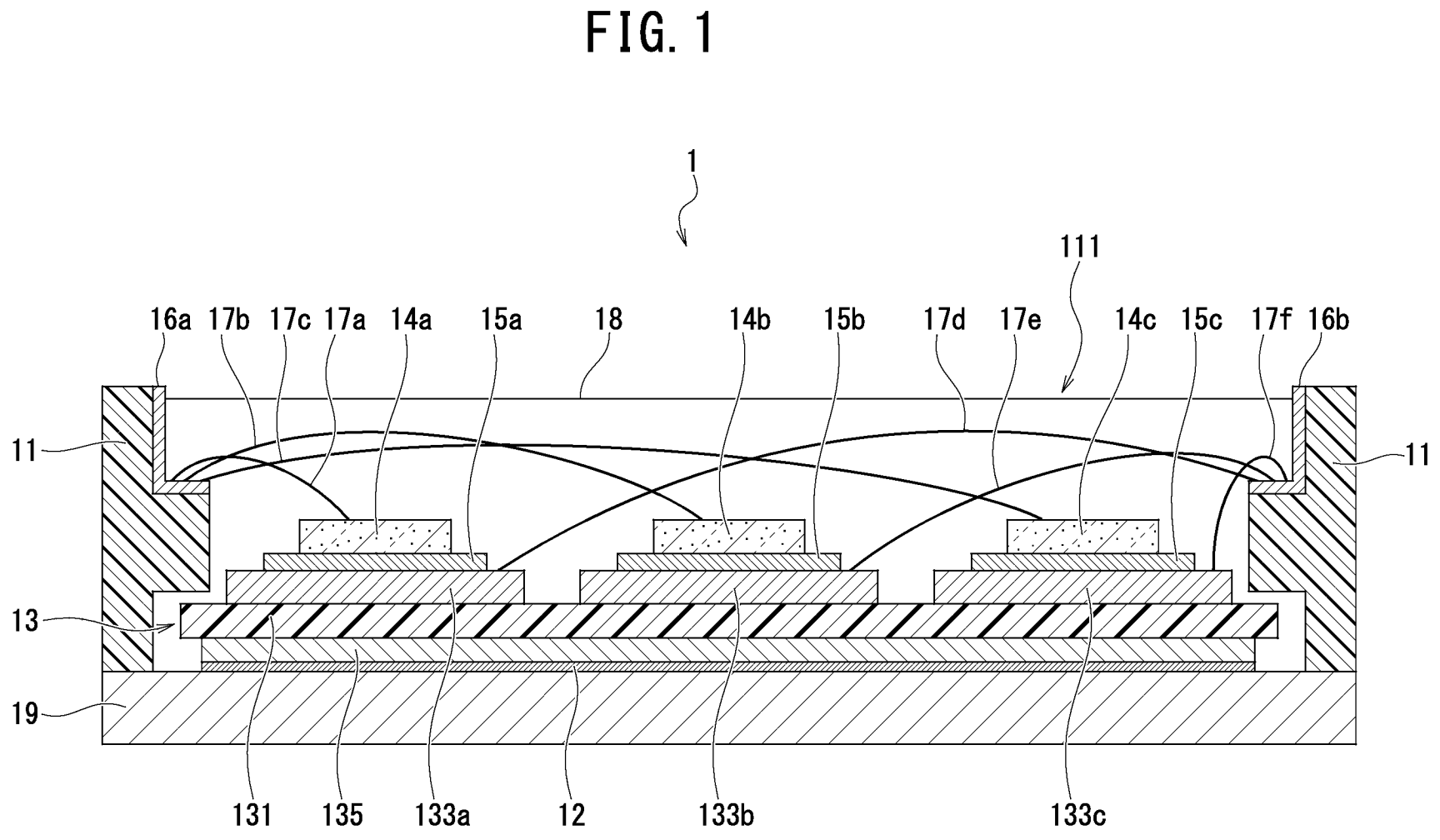

A schematic configuration of a semiconductor module 1 manufactured by the method for manufacturing a semiconductor module according to the present embodiment is described using FIG. 1. FIG. 1 is a diagram schematically illustrating a cross-section of the semiconductor module 1 cut at a predetermined point where an insulating wiring board 13 included in the semiconductor module 1 is arranged. For ease of understanding, FIG. 1 illustrates a sealing resin 18 without hatching.

As illustrated in FIG. 1, the semiconductor module 1 includes a case 11 that defines a space 111. The case 11 is made of, for example, insulating thermoplastic resin.

The semiconductor module 1 includes the insulating wiring board 13 arranged in the space 111. The insulating wiring board 13 includes an insulating substrate 131 having, for example, a rectangular flat plate shape. The insulating wiring board 13 is, for example, a direct copper bonding (DCB) substrate or an active metal brazing (AMB) substrate. The insulating wiring board 13 includes a plurality of conductive patterns 133a, 133b, and 133c formed on an upper surface (the sealing resin 18 (see below for details) side) of the insulating substrate 131 and a heat transfer member 135 having a rectangular flat plate shape formed on a lower surface (a cooler 19 (see below for details) side) of the insulating substrate 131. The insulating substrate 131 is made of, for example, a ceramic such as alumina (Al$_2$O$_3$) or aluminum nitride (AlN). The conductive patterns 133*a*, 133*b*, and 133*c* and the heat transfer member 135 are made of, for example, copper.

The semiconductor module 1 includes a plurality of sintered metal layers 15*a*, 15*b*, and 15*c* formed on the conductive patterns 133*a*, 133*b*, and 133*c* and a plurality of semiconductor chips 14*a*, 14*b*, and 14*c* arranged on the plurality of sintered metal layers 15*a*, 15*b*, and 15*c*. The sintered metal layers 15*a*, 15*b*, and 15*c* are formed by sintering of sintering materials 151*a*, 151*b*, and 151*c* (not illustrated in FIG. 1; see FIGS. 3 and 4). Therefore, the semiconductor chip 14*a* is bonded to the conductive pattern 133*a* by the sintered metal layer 15*a*, the semiconductor chip 14*b* is bonded to the conductive pattern 133*b* by the sintered metal layer 15*b*, and the semiconductor chip 14*c* is bonded to the conductive pattern 133*c* by the sintered metal layer 15*c*.

Although details are described below, the present embodiment uses an upper die 3A (not illustrated in FIG. 1; see FIGS. 3 and 4) including a protrusion at locations corresponding to arrangement positions of the semiconductor chips 14*a*, 14*b*, and 14*c*, and pressurizes and heats the sintering materials 151*a*, 151*b*, and 151*c* individually to sinter the sintering materials 151*a*, 151*b*, and 151*c*. This allows uniform pressurization and heating onto the sintering materials 151*a*, 151*b*, and 151*c* for bonding the semiconductor chips 14*a*, 14*b*, and 14*c* to the insulating wiring board 13.

The sintering materials 151*a*, 151*b*, and 151*c* are those prepared by mixing fine metal particles with an organic material coating therearound into an organic solvent. By pressurizing and heating the sintering materials 151*a*, 151*b*, and 151*c* arranged between the objects to be bonded, the organic solvent and the coated organic material vaporize, and the exposed fine metal particles fuse with each other to form the sintered metal layers 15*a*, 15*b*, and 15*c*, which are porous. Examples of the metal particles to be used include silver (Ag) or copper (Cu) having a particle diameter of several micrometers to several tens of micrometers. The sintered metal layers 15*a*, 15*b*, and 15*c* are formed by using, for example, a silver-based sintering material or a copper-based sintering material. The sintering materials 151*a*, 151*b*, and 151*c* have, for example, a thermal conductivity of about from 200 W/mK to 300 W/mK (pure silver: about 400 W/mK), a thermal expansion coefficient of about 20×10$^{-6}$/° C., and a melting point of about 960° C. Therefore, the sintered metal layers 15*a*, 15*b*, and 15*c* formed by sintering the sintering materials 151*a*, 151*b*, and 151*c* exhibit stable strength at operating temperatures for the semiconductor module 1 (e.g., from 150° C. to 170° C.).

The semiconductor chip 14*a* is connected to a terminal 16*a* provided on a case 11 by a bonding wire 17*a*. The semiconductor chip 14*b* is connected to a terminal (not illustrated) provided on the case 11 by a bonding wire 17*b*. The semiconductor chip 14*c* is connected to a terminal (not illustrated) provided on the case 11 by a bonding wire 17*c*. The conductive pattern 133*a* is connected to a terminal 16*b* provided on the case 11 by a bonding wire 17*d*. The conductive pattern 133*b* is connected to a terminal (not illustrated) provided on the case 11 by a bonding wire 17*e*. The conductive pattern 133*c* is connected to a terminal (not illustrated) provided on the case 11 by a bonding wire 17*f*.

On the semiconductor chips 14*a*, 14*b*, and 14*c* are formed power semiconductor elements such as, for example, insulated gate bipolar transistors (IGBTs) and/or metal-oxide-semiconductor field-effect transistors (MOSFETs). Therefore, a control signal from a controller (not illustrated) included in the semiconductor module 1 is input to the power semiconductor elements formed on the semiconductor chips 14*a*, 14*b*, and 14*c* via the terminal 16*a*, other terminals, and the bonding wires for gate control (not illustrated). As a result, the power semiconductor elements are on-off controlled at predetermined timings to convert, for example, DC power input from an outside to AC power and output to the conductive patterns 133*a*, 133*b*, and 133*c*. The semiconductor module 1 outputs the AC power input to the conductive patterns 133*a*, 133*b*, and 133*c* from the semiconductor chips 14*a*, 14*b*, and 14*c* through the sintered metal layers 15*a*, 15*b*, and 15*c* to an unillustrated load (e.g., a motor) via the bonding wires 17*d*, 17*e*, and 17*f*, the terminal 16*b*, and the other terminals. This allows the semiconductor module 1 to drive the load with the AC power generated by the semiconductor chips 14*a*, 14*b*, and 14*c*.

The semiconductor module 1 includes the cooler 19 attached to the case 11. The heat transfer member 135 is connected to the cooler 19 by a bonding layer 12 formed by using, for example, a sintering material. Alternatively, the heat transfer member 135 may be connected to the cooler 19 by a solder material. Heat generated during operation of the power semiconductor elements formed on the semiconductor chips 14*a*, 14*b*, and 14*c* is dissipated to the outside through the heat transfer member 135 and the cooler 19. As a result, the semiconductor module 1 can prevent thermal runaway in the power semiconductor elements formed on the semiconductor chips 14*a*, 14*b*, and 14*c*.

The semiconductor module 1 includes the sealing resin 18 formed in the space 111 to cover the insulating wiring board 13, the sintered metal layers 15*a*, 15*b*, and 15*c*, the semiconductor chips 14*a*, 14*b*, and 14*c*, and the bonding wires 17*a*, 17*b*, 17*c*, 17*d*, 17*e*, and 17*f*. The sealing resin 18 passes between the case 11 and the insulating substrate 131, and is formed also in a region surrounded by the case 11, the insulating wiring board 13, and the heat transfer member 135. The sealing resin 18 is made of a different material from that of the case 11, such as, for example, epoxy resin. The sealing resin 18 is a sealing member that seals components such as the semiconductor chips 14*a*, 14*b*, and 14*c* and the insulating wiring board 13 provided in the space 111. The sealing resin 18 can improve electrical insulation between the conductive patterns 133*a*, 133*b*, and 133*c* formed on the insulating wiring board 13 by sealing the insulating wiring board 13. This allows the sealing resin 18 to improve reliability of the semiconductor module 1.

In FIG. 1, the three semiconductor chips 14*a*, 14*b*, and 14*c* are arranged side by side above the insulating wiring board 13. However, the number of the semiconductor chips to be arranged above the insulating wiring board 13 and the number and shape of the conductive patterns to be formed on the insulating wiring board 13 are not limited to those illustrated in FIG. 1. Additionally, although FIG. 1 illustrates the single insulating wiring board 13 arranged in the case 11, the insulating wiring board 13 is not limited to a single wiring board, and a plurality of insulating wiring boards 13 may be arranged in the case 11.

(Method for Manufacturing Semiconductor Module)

Next, the method for manufacturing a semiconductor module according to the present embodiment is described using FIGS. 2 to 6. The method for manufacturing a semiconductor module according to the present embodiment is described by exemplifying a method for manufacturing the semiconductor module 1 illustrated in FIG. 1. FIG. 2 illustrates an example of a flow of steps of bonding the semiconductor chips 14*a*, 14*b*, and 14*c* to the insulating wiring board 13 in the method for manufacturing the semiconductor module 1 according to the present embodiment.

As illustrated in FIG. 2, at step S11 in the method for manufacturing the semiconductor module 1 according to the present embodiment, a step of arranging the insulating wiring board 13 is executed. Specifically, at step S11, the insulating wiring board 13 is arranged on a lower die 2A, as illustrated in FIG. 3. The lower die 2A is made of, for example, a metal material or a ceramic material (e.g., silicon nitride or the like) for dies. The lower die 2A includes a recessed portion 21 for arranging the insulating substrate 131 and the heat transfer member 135 included in the insulating wiring board 13. Therefore, when the insulating wiring board 13 is arranged on the lower die 2A, the conductive patterns 133a, 133b, and 133c included in the insulating wiring board 13 protrude from the lower die 2A.

The lower die 2A is attached to a device for manufacturing a semiconductor module. The lower die 2A is heated before arranging the insulating wiring board 13 in order to apply heat to the sintering materials 151a, 151b, and 151c at a later step, and has a temperature of, for example, 250° C. or higher. The lower die 2A may be attached to the manufacturing device after being heated or may be heated by the manufacturing device.

At step S13 following step S11, a sintering material and semiconductor chip arrangement step is executed. Specifically, at step S13, the sintering material 151a, 151b, 151c is arranged at a plurality of locations on the insulating wiring board 13, and the semiconductor chip 14a, 14b, 14c is arranged on each of the plurality of sintering materials 151a, 151b, and 151c, as illustrated in FIG. 3. In the present embodiment, after arranging the sintering materials 151a, 151b, and 151c on the insulating wiring board 13, the semiconductor chips 14a, 14b, and 14c are arranged on the sintering materials 151a, 151b, and 151c.

The sintering materials 151a, 151b, and 151c arranged on the insulating wiring board 13 are in a paste or sheet form. In the present embodiment, the sintering materials 151a, 151b, and 151c are, for example, in a paste form. The sintering materials 151a, 151b, and 151c are formed in a desired bonding form at predetermined locations on the conductive patterns 133a, 133b, and 133c by squeegee or by application.

After arranging the sintering materials 151a, 151b, and 151c on the insulating wiring board 13, the semiconductor chips 14a, 14b, and 14c are arranged on the sintering materials 151a, 151b, and 151c, respectively, as illustrated in FIG. 3. The semiconductor chip 14a is arranged on the sintering material 151a, the semiconductor chip 14b is arranged on the sintering material 151b, and the semiconductor chip 14c is arranged on the sintering material 151c.

Terminals of power semiconductor elements formed on the semiconductor chips 14a, 14b, and 14c are exposed on surfaces where the semiconductor chips 14a, 14b, and 14c contact the sintering materials 151a, 151b, and 151c. In the present embodiment, in order to bring an entirety of the terminals into contact with the sintering materials 151a, 151b, and 151c, the sintering materials 151a, 151b, and 151c are formed one size larger than the semiconductor chips 14a, 14b, and 14c. Therefore, as illustrated in FIG. 3, the sintering materials 151a, 151b, and 151c include protruding portions 151a-1, 151b-1, and 151c-1 protruding from peripheries of the semiconductor chips 14a, 14b, and 14c and contacting portions 151a-2, 151b-2, and 151c-2 in contact with lower surfaces of the semiconductor chips 14a, 14b, and 14c. The protruding portion 151a-1, 151b-1, 151c-1 and the contacting portion 151a-2, 151b-2, 151c-2 are integrally formed and have no boundary. However, for ease of understanding, FIG. 3 and drawings after FIG. 4 illustrate a boundary between both portions by means of dotted lines.

At step S15 following step S13, a first protection sheet arrangement step is executed. Specifically, at step S15, as illustrated in FIG. 3, a first protection sheet 4A is arranged on the semiconductor chips 14a, 14b, and 14c. The first protection sheet 4A has a single membrane form capable of covering, for example, an entirety of a plurality of semiconductor chips (in the present embodiment, the semiconductor chips 14a, 14b, and 14c) arranged above the insulating wiring board 13. The first protection sheet 4A has a thickness of, for example, from 0.1 mm to 0.5 mm. The first protection sheet 4A is made of, for example, fluororesin (e.g., polytetrafluoroethylene (PTFE)) or polyimide resin (PI). The first protection sheet 4A is provided as needed to prevent the sintering materials 151a, 151b, and 151c and sidewalls and like of the semiconductor chips 14a, 14b, and 14c from being dirtied by a structure 5A (see below for details) during manufacturing of the semiconductor module 1.

At step S17 following step S15, a structure arrangement step is executed. Specifically, the structure 5A is arranged above the protruding portions 151a-1, 151b-1, and 151c-1 of the sintering materials 151a, 151b, and 151c protruding from the periphery of each of the plurality of semiconductor chips 14a, 14b, and 14c. The structure 5A is in a sheet form including through holes 51a, 51b, and 51c formed to allow insertion of the semiconductor chips 14a, 14b, and 14c at locations corresponding to each of the plurality of the semiconductor chips 14a, 14b, and 14c. When the through holes 51a, 51b, and 51c are arranged to correspond to the semiconductor chips 14a, 14b, and 14c, peripheral portions of the through holes 51a, 51b, and 51c are located above the protruding portions 151a-1, 151b-1, and 151c-1. The through hole 51a is formed to correspond to the semiconductor chip 14a, the through hole 51b is formed to correspond to the semiconductor chip 14b, and the through hole 51c is formed to correspond to the semiconductor chip 14c. The structure 5A has a shape capable of completely covering the protruding portions 151a-1, 151b-1, and 151c-1. The structure 5A is formed by, for example, carbon sheet. The structure 5A has a hardness of, for example, 80 points ±5% on a type A durometer according to JIS K 6253.

At step S19 following step S17, a second protection sheet arrangement step is executed. Specifically, at step S19, a second protection sheet 6A is arranged on the structure 5A, as illustrated in FIG. 3. The second protection sheet 6A has a single membrane form capable of covering, for example, an entirety of the structure 5A. The second protection sheet 6A is made of, for example, fluororesin (e.g., polytetrafluoroethylene (PTFE)) or polyimide resin (PI), and has a thickness of, for example, from 0.1 mm to 0.5 mm.

At step S21 following step S19, a buffer material arrangement step is executed. Specifically, at step S21, a single buffer material 7A is arranged above the structure 5A. The buffer material 7A is arranged to cover the through holes 51a, 51b, and 51c formed in the structure 5A and the peripheral portions thereof. The buffer material 7A is formed by using, for example, a carbon sheet or the like that exhibits low elastic modulus even during sintering of the sintering materials 151a, 151b, and 151c. The buffer material 7A has a heat resistance of 250° C. or higher, a Poisson's ratio of 0.2 or less, and a hardness of 80 points ±5% on a type A durometer according to JIS K 6253. Since the buffer material 7A has a hardness of 80 points ±5% on a type A durometer according to JIS K 6253, the buffer material 7A can be prevented from breaking through the second protection sheet 6A to damage the semiconductor chips 14a, 14b, and 14c during sintering of the sintering materials 151a, 151b, and 151c. In addition, the buffer material 7A has a compressive elastic modulus of 9 MPa at a temperature of 250° C. The buffer material 7A is harder than the structure 5A, and is softer than the semiconductor chips 14a, 14b, and 14c. Furthermore, the buffer material 7A has a thickness that can absorb a difference in height (e.g., a difference smaller than 10 μm) between surfaces of the semiconductor chips 14a, 14b, and 14c facing the buffer material 7A side and can apply substantially uniform pressure to the sintering materials 151a, 151b, and 151c.

At step S23 following step S21, an upper die arrangement step is executed. Specifically, at step S23, the upper die 3A including a space 31 is arranged on the buffer material 7A with the space 31 facing the lower die 2A side, as illustrated in FIG. 3. The upper die 3A is attached to the device for manufacturing a semiconductor module to which the lower die 2A is attached.

The space 31 formed in the upper die 3A has an opening large enough to insert the conductive patterns 133a, 133b, and 133c, the sintering materials 151a, 151b, and 151c, the semiconductor chips 14a, 14b, and 14c, the first protection sheet 4A, the structure 5A, the second protection sheet 6A, and the buffer material 7A. The space 31 has a depth shallower than a length from the lower die 2A to the buffer material 7A before inserting the semiconductor chips 14a, 14b, and 14c into the through holes 51a, 51b, and 51c of the structure 5A and applying pressure to the sintering materials 151a, 151b, and 151c. Here, the length from the lower die 2A to the buffer material 7A is a length from a surface of the lower die 2A including an opening end of the recessed portion 21 to a surface of the buffer material 7A facing the upper die 3A. This allows application of a desired pressure to the sintering materials 151a, 151b, and 151c by sintering the materials 151a, 151b, and 151c with the upper die 3A in contact with the lower die 2A (see below for details).

The upper die 3A is made of, for example, the same metal material or ceramic material (e.g., silicon nitride or the like) for dies as that of the lower die 2A. The upper die 3A may be made of a different metal material from that of the lower die 2A. The upper die 3A is heated before being arranged on the lower die 2A in order to apply heat to the sintering materials 151a, 151b, and 151c at a later step, and has a temperature of, for example, 250° C. or higher. The upper die 3A may be attached to the device for manufacturing a semiconductor module after being heated or may be heated by the manufacturing device.

At step S25 following step S23, a sintering material pressurization and heating step is executed. Specifically, at step S25, the upper die 3A sinters by pressurizing and heating the plurality of sintering materials 151a, 151b, and 151c through the structure 5A at the sintering material protruding portions 151a-1, 151b-1, and 151c-1 and through the semiconductor chips 14a, 14b, and 14c at the sintering material contacting portions 151a-2, 151b-2, and 151c-2 under the semiconductor chips 14a, 14b, and 14c, as illustrated in FIG. 4. In other words, the plurality of sintering materials 151a, 151b, and 151c is sintered by being pressurized and heated by the upper die 3A through the buffer material 7A, the plurality of semiconductor chips 14a, 14b, and 14c, and the structure 5A with the plurality of sintering materials 151a, 151b, and 151c, the plurality of semiconductor chips 14a, 14b, and 14c, the structure 5A, and the buffer material 7A contained in the space 31 formed in the upper die 3A. In the present embodiment, the first protection sheet 4A is interposed between the plurality of semiconductor chips 14a, 14b, and 14c and the structure 5A, and the second protection sheet 6A is interposed between the structure 5A and the buffer material 7A. Accordingly, the upper die 3A pressurizes and heats the sintering materials 151a, 151b, and 151c with the plurality of sintering materials 151a, 151b, and 151c, the plurality of semiconductor chips 14a, 14b, and 14c, the first protection sheet 4A, the structure 5A, the second protection sheet 6A, and the buffer material 7A contained in the space 31.

In the sintering material pressurization and heating step, the lower die 2A supports the insulating wiring board 13 from the heat transfer member 135 side while securing the insulating wiring board 13. Additionally, the lower die 2A has a temperature of, for example, 250° C. or higher. Therefore, in the sintering material pressurization and heating step, the lower die 2A pressurizes and heats the sintering materials 151a, 151b, and 151c through the insulating wiring board 13. Thus, the sintering materials 151a, 151b, and 151c are sintered, for example, at a pressure of from 10 MPa to 50 MPa and a temperature of from 200° C. to 300° C. applied by the upper die 3A and the lower die 2A.

The buffer material 7A is softer than the semiconductor chips 14a, 14b, and 14c, and is harder than the structure 5A. Therefore, as illustrated in FIG. 4, when the lower die 2A closes the opening of the space 31 of the upper die 3A and the lower and upper dies 2A and 3A contact with each other, the buffer material 7A is pushed up to the upper die 3A side by the semiconductor chips 14a, 14b, and 14c, and pushes the structure 5A down to the lower die 2A side. As a result, a surface of the buffer material 7A on the lower die 2A side will have a shape that follows a stepped shape formed by the conductive patterns 133a, 133b, and 133c, the sintering materials 151a, 151b, and 151c, and the semiconductor chips 14a, 14b, and 14c. The buffer material 7A is compressed with the surface on the lower die 2A side deformed as described above during sintering of the sintering materials 151a, 151b, and 151c.

The buffer material 7A exhibits low elastic modulus even during the sintering. Therefore, compressing the buffer material 7A in the sintering material pressurization and heating step can absorb height tolerances of the respective surfaces of the semiconductor chips 14a, 14b, and 14c facing the buffer material 7A side. Here, the surfaces of the semiconductor chips 14a, 14b, and 14c facing the buffer material 7A side are those of the semiconductor chips 14a, 14b, and 14c in contact with the first protection sheet 4A. Additionally, a surface height of each of the semiconductor chips 14a, 14b, and 14c corresponds to, for example, a distance from the surface of the insulating substrate 131 on which the plurality of conductive patterns 133a, 133b, and 133c is formed.

In addition, in the sintering material pressurization and heating step, force is applied to the buffer material 7A in a direction (vertical direction) in which the insulating wiring board 13, the semiconductor chips 14a, 14b, and 14c, the first protection sheet 4A, the structure 5A, the second protection sheet 6A, and the buffer material 7A are stacked together. Therefore, the buffer material 7A applies force with the same strength as the above force in a direction (lateral direction) parallel to an in-plane of the insulating wiring board 13. Around the buffer material 7A are arranged sidewalls of the upper die 3A. Accordingly, in the sintering material pressurization and heating step, the buffer material 7A applies force to the sidewalls of the upper die 3A in a direction pushing and widening the upper die 3A. This leads to non-uniform bonding pressurization to each of the semiconductor chips 14a, 14b, and 14c and the structure 5A, which may reduce bonding quality between the semiconductor chips 14a, 14b, and 14c and the conductive patterns 133a, 133b, and 133c.

As described above, the buffer material 7A has a Poisson's ratio of 0.2 or less. Therefore, the buffer material 7A is characterized by being hard to spread laterally. The buffer material 7A can prevent bonding pressurization to each of the semiconductor chips 14a, 14b, and 14c and the structure 5A from becoming non-uniform due to lateral spread. Additionally, when pressurized vertically, the buffer material 7A applies a weaker force to the sidewalls of the upper die 3A than a buffer material made of a material having a Poisson's ratio greater than, for example, 0.2. Thus, since the upper die 3A can be fabricated with an inexpensive material having low hardness, the semiconductor module 1 can be manufactured at low cost.

Applying pressure and heat to the sintering materials 151a, 151b, and 151c by means of the upper die 3A and the lower die 2A promotes sintering reaction in the sintering materials 151a, 151b, and 151c. In a process in which the sintering reaction is promoted, pressure is applied to the contacting portion 151a-2 of the sintering material 151a through the semiconductor chip 14a, and pressure is applied to the protruding portion 151a-1 of the sintering material 151a from the structure 5A. A surface of the semiconductor chip 14a that is in contact with the first protection sheet 4A and a surface of the structure 5A that is in contact with the second protection sheet 6A and that is above the protruding portion 151a-1 have substantially the same height with respect to the surface of the insulating substrate 131 on which the plurality of conductive patterns 133a, 133b, and 133c is formed, although there is a difference by the thickness of the first protection sheet 4A. Accordingly, pressure applied to the contacting portion 151a-2 of the sintering material 151a from the upper die 3A through the semiconductor chip 14a and pressure applied to the protruding portion 151a-1 of the sintering material 151a from the upper die 3A through the structure 5A have substantially the same strength. This promotes sintering reaction to the same degree in the contacting portion 151a-2 and protruding portion 151a-1 of the sintering material 151a in the sintering material pressurization and heating step.

Similarly, in the process in which the sintering reaction is promoted, pressure is applied to the contacting portion 151b-2 of the sintering material 151b through the semiconductor chip 14b, and pressure is applied to the protruding portion 151b-1 of the sintering material 151b from the structure 5A. A surface of the semiconductor chip 14b that is in contact with the first protection sheet 4A and a surface of the structure 5A that is in contact with the second protection sheet 6A and that is above the protruding portion 151b-1 have substantially the same height with respect to the surface of the insulating substrate 131 on which the plurality of conductive patterns 133a, 133b, and 133c is formed, although there is a difference by the thickness of the first protection sheet 4A. Accordingly, pressure applied to the contacting portion 151b-2 of the sintering material 151b from the upper die 3A through the semiconductor chip 14b and pressure applied to the protruding portion 151b-1 of the sintering material 151b from the upper die 3A through the structure 5A have substantially the same strength. This promotes sintering reaction to the same degree in the contacting portion 151b-2 and protruding portion 151b-1 of the sintering material 151b in the sintering material pressurization and heating step.

Similarly, in the process in which the sintering reaction is promoted, pressure is applied to the contacting portion 151c-2 of the sintering material 151c through the semiconductor chip 14c, and pressure is applied to the protruding portion 151c-1 of the sintering material 151c from the structure 5A. A surface of the semiconductor chip 14c that is in contact with the first protection sheet 4A and a surface of the structure 5A that is in contact with the second protection sheet 6A and that is above the protruding portion 151c-1 have substantially the same height with respect to the surface of the insulating substrate 131 on which the plurality of conductive patterns 133a, 133b, and 133c is formed, although there is a difference by the thickness of the first protection sheet 4A. Accordingly, pressure applied to the contacting portion 151c-2 of the sintering material 151c from the upper die 3A through the semiconductor chip 14a and pressure applied to the protruding portion 151c-1 of the sintering material 151a from the upper die 3A through the structure 5A have substantially the same strength. This promotes sintering reaction to the same degree in the contacting portion 151a-2 and protruding portion 151c-1 of the sintering material 151c in the sintering material pressurization and heating step.

The pressure applied to the protruding portion 151a-1 and contacting portion 151a-2 of the sintering material 151a from the upper die 3A through the semiconductor chip 14a and the structure 5A, the pressure applied to the protruding portion 151b-1 and contacting portion 151b-2 of the sintering material 151b from the upper die 3A through the semiconductor chip 14b and the structure 5A, and the pressure applied to the protruding portion 151c-1 and contacting portion 151c-2 of the sintering material 151c from the upper die 3A through the semiconductor chip 14c and the structure 5A are substantially the same. Accordingly, equivalent and desired sintering reactions are promoted in the protruding portion 151a-1 and contacting portion 151a-2 of the sintering material 151a, the protruding portion 151b-1 and contacting portion 151b-2 of the sintering material 151b, and the protruding portion 151c-1 and contacting portion 151c-2 of the sintering material 151c. This results in formation of the sintered metal layers 15a, 15b, and 15c that have sintered bodies composed by bonding of silver particles or copper particles contained in the sintering materials 151a, 151b, and 151c in a paste or sheet form and that are conductive.

When sintering the sintering materials 151a, 151b, and 151c, the first protection sheet 4A covers upper surfaces and side surfaces of the semiconductor chips 14a, 14b, and 14c, surfaces of the sintering materials 151a, 151b, and 151c, surfaces of the conductive patterns 133a, 133b, and 133c, and a surface of the insulating substrate 132. Therefore, when sintering the sintering materials 151a, 151b, and 151c, the first protection sheet 4A can prevent the upper surfaces and side surfaces of the semiconductor chips 14a, 14b, and 14c, the surfaces of the sintering materials 151a, 151b, and 151c, the surfaces of the conductive patterns 133a, 133b, and 133c, and the surface of the insulating substrate 132 from being dirtied by the structure 5A.

At step S27 following step S25, an upper die retreat step is executed. Specifically, at step S27, the upper die 3A is retreated, for example, above the lower die 2A, and the buffer material 7A and the like contained in the space 31 are exposed externally, as illustrated in FIG. 5.

At step S29 following step S27, a buffer material removal step is executed. Specifically, at step S29, the buffer material 7A is removed from the second protection sheet 6A, as illustrated in FIG. 5. On the surface of the buffer material 7A on the lower die 2A side is left the shape following the shapes of the semiconductor chips 14a, 14b, and 14c and the like. Therefore, the buffer material 7A is a disposable member that is replaced each time the semiconductor module 1 is manufactured.

Figure 6:
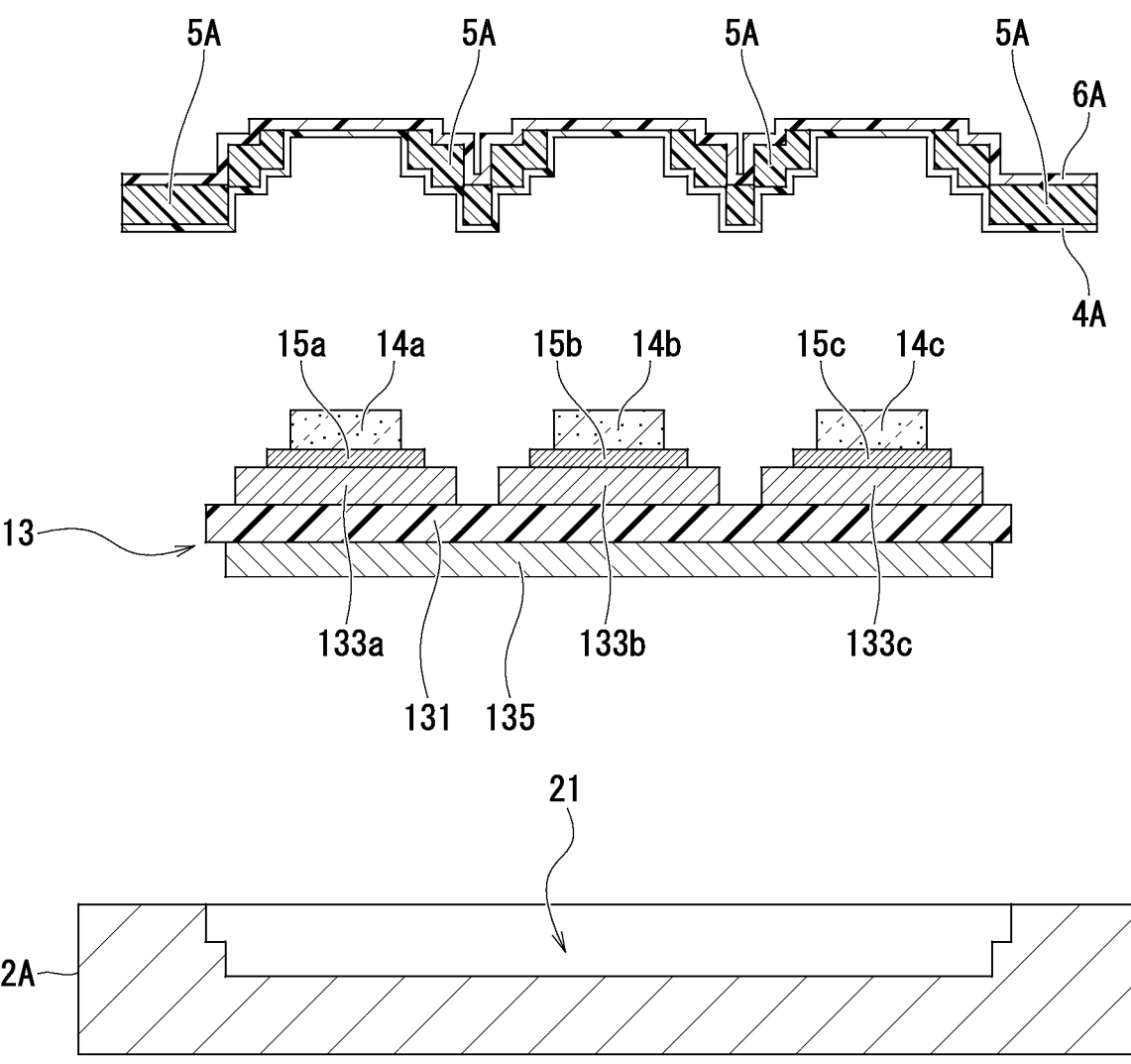
FIG. 6 is a diagram schematically illustrating a structure and protection sheet removal step and an insulating wiring board removal step in the method for manufacturing a semiconductor module according to Embodiment 1 of the present invention.

At step S31 following step S29, a second protection sheet, structure, and first protection sheet removal step is executed. Specifically, at step S31, the second protection sheet 6A, the structure 5A, and the first protection sheet 4A are removed, as illustrated in FIG. 6. This leaves the semiconductor chips 14a, 14b, and 14c bonded to the conductive patterns 133a, 133b, and 133c by the sintered metal layers 15a, 15b, and 15c, on the insulating wiring board 13. On the second protection sheet 6A, the structure 5A, and the first protection sheet 4A is left the shape following the shapes of the semiconductor chips 14a, 14b, and 14c and the like. Therefore, the second protection sheet 6A, the structure 5A, and the first protection sheet 4A are disposable members that are replaced each time the semiconductor module 1 is manufactured.

At step S33 following step S31, an insulating wiring board removal step is executed. Specifically, at step S33, the insulating wiring board 13 including the semiconductor chips 14a, 14b, and 14c bonded to the conductive patterns 133a, 133b, and 133c by the sintered metal layers 15a, 15b, and 15c is removed from the lower die 2A, as illustrated in FIG. 6. This completes the steps of bonding the semiconductor chips 14a, 14b, and 14c to the insulating wiring board 13.

Although illustration is omitted, as illustrated in FIG. 1, the insulating wiring board 13 with the semiconductor chips 14a, 14b, and 14c bonded thereto is arranged in the space 111 of the case 11 with the cooler 19 attached thereto. Next, the semiconductor chips 14a, 14b, and 14c and the terminal 16a and the like arranged on the case 11 are connected by the bonding wires 17a, 17b, and 17c, and the conductive patterns 133a, 133b, and 133c and the terminal 16b and the like arranged on the case 11 are connected by the bonding wires 17d, 17e, and 17f. Then, the sealing resin 18 is poured into the space 111 to cover the semiconductor chips 14a, 14b, and 14c, the bonding wires 17a, 17b, 17c, 17d, 17e, and 17f, and the conductive patterns 133a, 133b, and 133c. This completes the semiconductor module 1.

(Effects of Method for Manufacturing Semiconductor Module)

Next, effects of the method for manufacturing a semiconductor module according to the present embodiment are described using FIGS. 7 to 11 with reference to FIGS. 3 and 4.

Comparative Example 1

Figure 7:
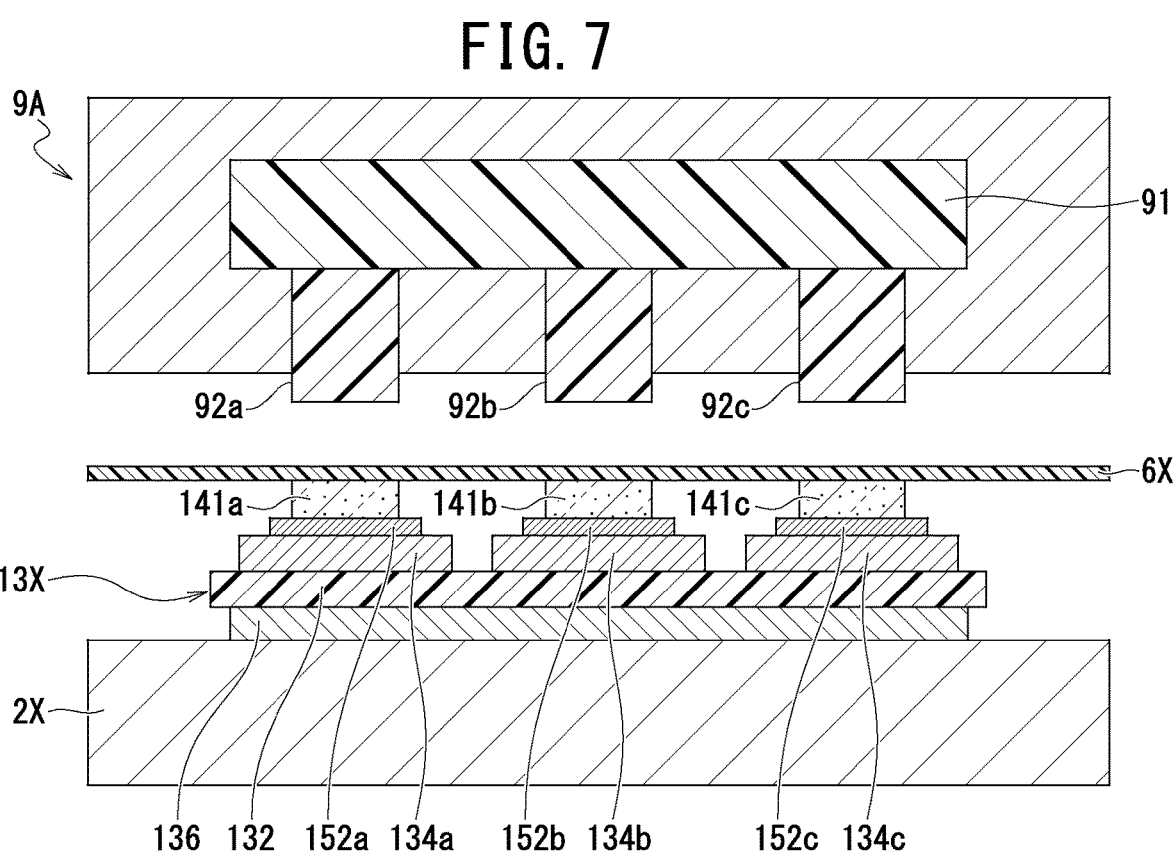
FIG. 7 is a diagram schematically illustrating a step of arranging a sintering material pressurizing and heating mechanism in a method for manufacturing a semiconductor module according to Comparative Example 1.
Figure 8:
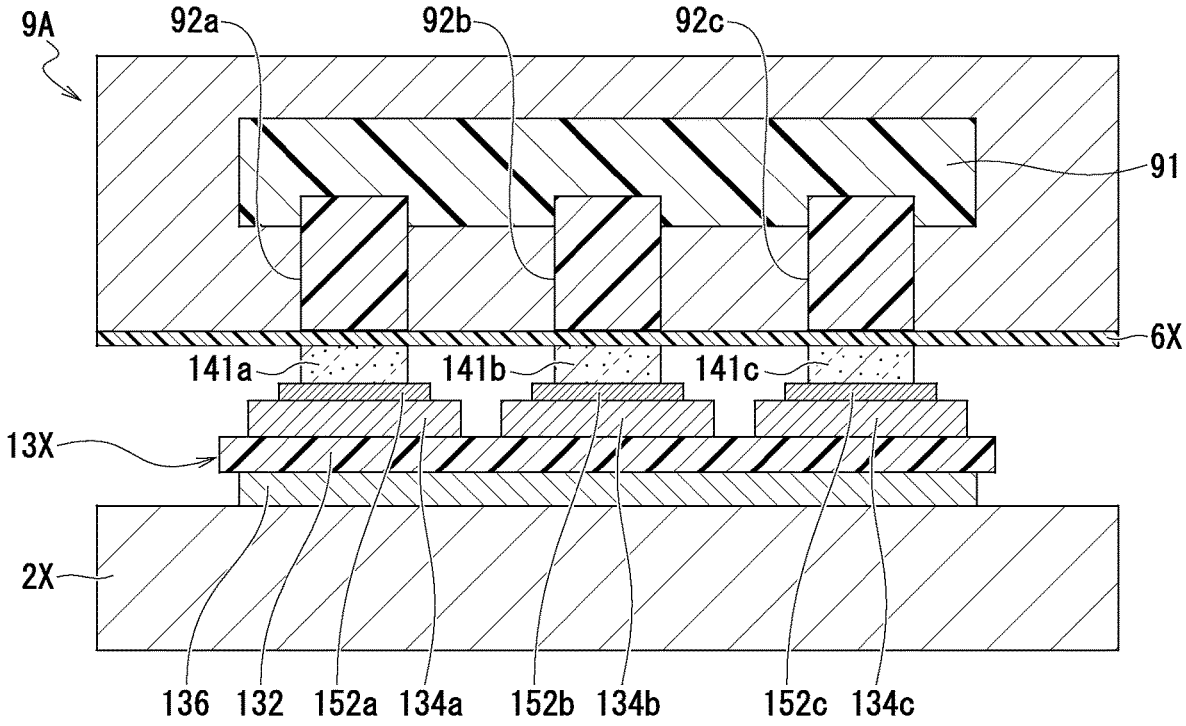
FIG. 8 is a diagram schematically illustrating a sintering material pressurization and heating step in the method for manufacturing a semiconductor module according to Comparative Example 1.

FIGS. 7 and 8 are diagrams for illustrating a sintering material pressurization and heating step in a method for manufacturing a semiconductor module according to Comparative Example 1.

As illustrated in FIG. 7, in the method for manufacturing a semiconductor module according to Comparative Example 1, an insulating wiring board 13X is arranged on a lower die 2X having a rectangular flat plate shape. Similarly to the insulating wiring board 13 in the present embodiment, the insulating wiring board 13X includes an insulating substrate 132, conductive patterns 134a, 134b, and 134c formed on one surface of the insulating substrate 132, and a heat transfer member 136 formed on the other surface of the insulating substrate 132. The insulating substrate 132 has the same effect and function as those of the insulating substrate 131 in the present embodiment. The conductive patterns 134a, 134b, and 134c have the same effect and function as those of the conducive patterns 133a, 133b, and 133c in the present embodiment. The heat transfer member 136 has the same effect and function as those of the heat transfer member 135 in the present embodiment. The insulating wiring board 13X is arranged on the lower die 2X with the heat transfer member 136 facing the lower die 2X side.

Next, as illustrated in FIG. 7, sintering materials 152a, 152b, and 152c are formed at predetermined locations of the conductive patterns 134a, 134b, and 134c. The sintering materials 152a, 152b, and 152c have the same effect and function as those of the sintering materials 151a, 151b, and 151c in the present embodiment.

Then, as illustrated in FIG. 7, semiconductor chips 141a, 141b, and 141c are arranged on the sintering materials 152a, 152b, and 152c. The semiconductor chips 141a, 141b, and 141c have the same effect and function as those of the semiconductor chips 14a, 14b, and 14c in the present embodiment.

Next, as illustrated in FIG. 7, on the semiconductor chips 141a, 141b, and 141c is arranged a single protection sheet 6X that is large enough to cover all surfaces above the insulating wiring board 13X. The protection sheet 6X is arranged in contact with upper surfaces of the semiconductor chips 141a, 141b, and 141c.

Then, as illustrated in FIG. 7, an upper die 9A is arranged to face the lower die 2X above the lower die 2X with the insulating wiring board 13X and the like therebetween. The upper die 9A in Comparative Example 1 includes a pressurization mechanism 91 thereinside. The pressurization mechanism 91 has low elastic modulus, as in the buffer material 7A in the present embodiment. The upper die 9A includes individual pressurization portions 92a, 92b, and 92c whose one ends are in contact with the pressurization mechanism 91 and whose other ends protrude from the upper die 9A. The individual pressurization portions 92a, 92b, and 92c protrude toward the lower die 2X side when the upper die 9A is arranged to face the lower die 2X. The individual pressurization portions 92a, 92b, and 92c are arranged to correspond to arrangement positions of the semiconductor chips 141a, 141b, and 141c. Therefore, when the upper die 9A is arranged to face the lower die 2X with the insulating wiring board 13X therebetween, the individual pressurization portion 92a is arranged to face the semiconductor chip 141a with the protection sheet 6X therebetween, the individual pressurization portion 92b is arranged to face the semiconductor chip 141b with the protection sheet 6X therebetween, and the individual pressurization portion 92c is arranged to face the semiconductor chip 141c with the protection sheet 6X therebetween.

Next, as illustrated in FIG. 8, the sintering materials 151a, 152b, and 152c are pressurized by the upper die 9A and the lower die 2X. When the upper die 9A descends toward the lower die 2X, first, the ends of the individual pressurization portions 92a, 92b, and 92c contact the protection sheet 6X. The individual pressurization mechanism 91 is softer than the individual pressurization portions 92a, 92b, and 92c, the semiconductor chips 141a, 141b, and 141c, and the insulating wiring board 13X. Therefore, when the upper die 9A continues to descend even after the ends of the individual pressurization portions 92a, 92b, and 92c contact the protection sheet 6X, the individual pressurization portions 92a, 92b, and 92c bite into the pressurization mechanism 91 for the same length as portions protruding from the upper die 9A before the upper die 9A descends, as illustrated in FIG. 8. In a state where the surface of the upper die 9A facing the lower die 2X is almost flush with that of the lower die 2X, the upper die 9A pressurizes the sintering materials 152a, 152b, and 152*c* through the protection sheet 6X and the semiconductor chips 141*a*, 141*b*, and 141*c*.

The upper die 9A and the lower die 2X are heated and have a temperature of, for example, approximately 250° C., similarly to the upper die 3A and the lower die 2A in the present embodiment. This allows the upper die 9A and the lower die 2X to apply heat as well as pressure to the sintering materials 152*a*, 152*b*, and 152*c*. As a result, the sintering materials 152*a*, 152*b*, and 152*c* are sintered to bond the semiconductor chips 141*a*, 141*b*, and 141*c* and the insulating wiring board 13X (specifically, the conductive patterns 134*a*, 134*b*, and 134*c*) together.

Thus, the upper die 9A in Comparative Example 1 can pressurize and heat the sintering materials 152*a*, 152*b*, and 152*c*. However, the upper die 9A has a complicated structure because of a space required to arrange the pressurization mechanism 91 and openings required to arrange the individual pressurization portions 92*a*, 92*b*, and 92*c*. It is also necessary to provide the pressurization mechanism 91 in the space of the upper die 9A and provide the individual pressurization portions 92*a*, 92*b*, and 92*c* in the openings of the upper die 9A, making the structure and fabrication of the upper die 9A complicated. Furthermore, the arrangement positions and number of the semiconductor chips 141*a*, 141*b*, and 141*c* vary for each type of semiconductor module. Therefore, the upper die 9A requires to be fabricated for each type of semiconductor module.

Additionally, when the upper die 9A is repeatedly used, the same parts of the pressurization mechanism 91 are pushed up by the individual pressurization portions 92*a*, 92*b*, and 92*c*. Therefore, due to changes in elastic force over time at the same parts of the pressurization mechanism 91, it may be impossible to apply necessary force to the sintering materials 152*a*, 152*b*, and 152*c*. Accordingly, there is a limit to the number of times the pressurization mechanism 91 can be used.

Thus, in the method for manufacturing a semiconductor module according to Comparative Example 1, the manufacturing cost of the upper die 9A for use in manufacturing of a semiconductor module, replacement cost of the pressurization mechanism 91, and the like increase the manufacturing cost of a semiconductor module.

On the other hand, the method for manufacturing a semiconductor module according to the present embodiment can use the upper die 3A that has a simple box-shaped structure including the space 31 and an opening on one side thereof. Therefore, the upper die 3A can be fabricated at lower cost than the upper die 9A. Accordingly, the method for manufacturing a semiconductor module according to the present embodiment can reduce manufacturing costs for a semiconductor module more than the method for manufacturing a semiconductor module according to Comparative Example 1.

Figure 9:
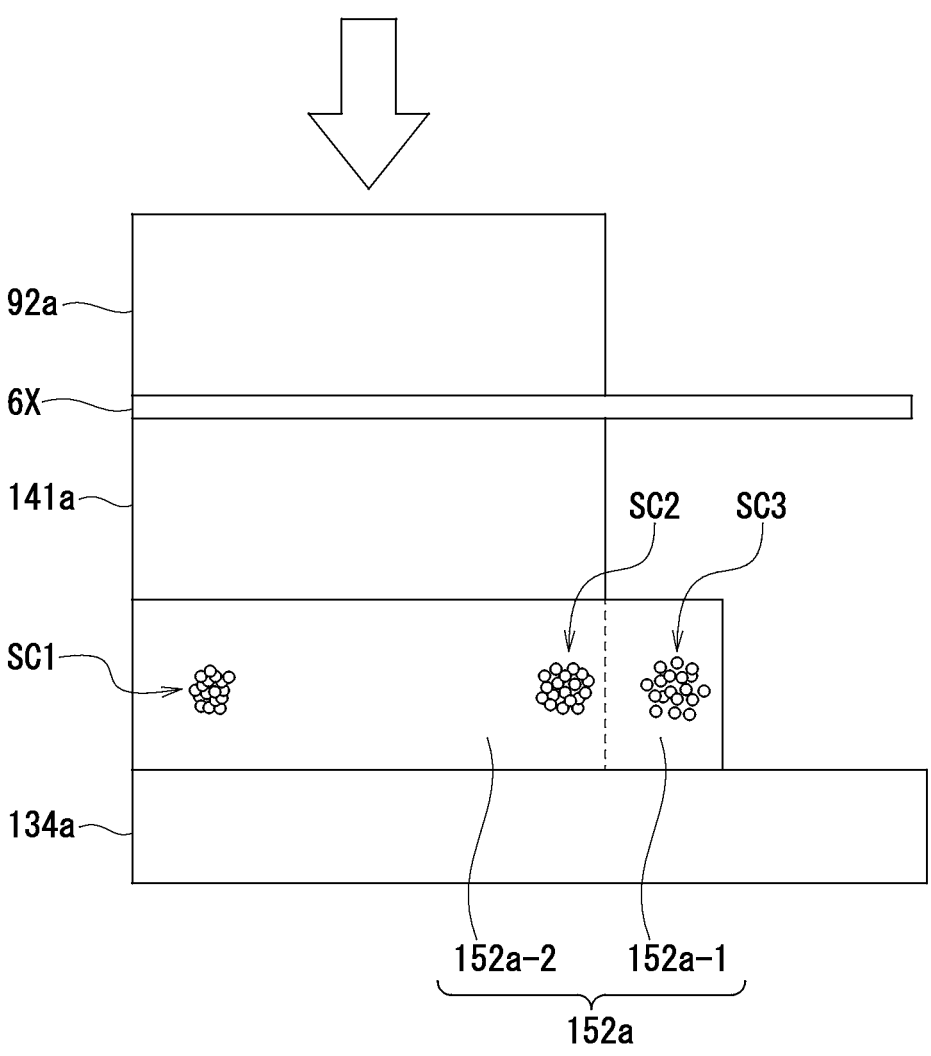
FIG. 9 is a diagram for illustrating a problem in the method for manufacturing a semiconductor module according to Comparative Example 1.

Furthermore, the method for manufacturing a semiconductor module according to Comparative Example 1 is problematic in that the sintering materials 152*a*, 152*b*, and 152*c* may not be able to be sintered sufficiently. FIG. 9 is a diagram schematically illustrating a process of sintering the sintering material 152*a*.

As illustrated in FIG. 9, the semiconductor chip 141*a* is arranged in contact with the contacting portion 152*a*-2 of the sintering material 152*a*. On the other hand, any member in contact with the upper die 9A (see FIG. 8) side is not arranged on the protruding portion 152*a*-1 of the sintering material 152*a*. Therefore, when, as indicated by a bold downward arrow in FIG. 9, pressure is applied from the upper die 9A to the lower die 2X side by the individual pressurization portion 92*a*, the contacting portion 152*a*-2 of the sintering material 152*a* arranged directly under the semiconductor chip 141*a* is subjected to pressure having substantially the same intensity as that of the pressure from the individual pressurization portion 92*a*. On the other hand, the pressure from the individual pressurization portion 92*a* escapes against the protruding portion 152*a*-1 of the sintering material 152*a* at a periphery of the semiconductor chip 141*a*.

As a result, in the contacting portion 152*a*-2 pressurized at substantially the same intensity as that of the pressure from the individual pressurization portion 92*a*, metal particles contained in the sintering material 152*a* are densely populated (a low air ratio state) into a sintered body SC1, whereas in the protruding portion 152*a*-1 from which the pressure from the individual pressurization portion 92*a* escapes, the metal particles contained in the sintering material 152*a* are sparsely populated (a high air ratio state) into a sintered body SC3. Therefore, as indicated by a bold horizontal arrow in FIG. 9, the metal particles contained in the sintering material 152*a* change from high density to low density from a center side to a periphery side of the semiconductor chip 141*a*. Additionally, even in the contacting portion 152*a*-2, the metal particles of the sintered body SC1 in a region near the center side of the semiconductor chip 141*a* are denser than those of a sintered body SC2 in a region near the periphery side of the semiconductor chip 141*a*. A sintered metal layer formed by sintering the sintering material 152*a* has desired mechanical characteristics, electrical characteristics, and thermal characteristics in the region with high density metal particles, but may not have desired mechanical, electrical, and thermal characteristics in the region with low density metal particles. As a result, in the sintered metal layer, a portion formed by sintering the protruding portion 152*a*-1 may be a starting point of a crack. Even in the sintering materials 152*b* and 152*c*, portions formed by sintering protruding portions thereof may be starting points of cracks, as in the sintering material 152*a*. Therefore, a semiconductor module manufactured by the method for manufacturing a semiconductor module according to Comparative Example 1 has a problem with degraded reliability.

On the other hand, the method for manufacturing a semiconductor module according to the present embodiment can apply substantially the same pressure as pressure applied to the contacting portions 151*a*-2, 151*b*-2, and 151*c*-2 of the sintering materials 151*a*, 151*b*, and 151*c* through the semiconductor chips 14*a*, 14*b*, and 14*c* to the protruding portions 151*a*-1, 151*b*-1, and 151*c*-1 of the sintering materials 151*a*, 151*b*, and 151*c* through the structure 5A. The sintered metal layers 15*a*, 15*b*, and 15*c* (see FIG. 1) formed by sintering the sintering materials 151*a*, 151*b*, and 151*c* can have sintered bodies with uniform density over an entire region. As a result, the sintered metal layers 15*a*, 15*b*, and 15*c* can have desired mechanical characteristics, electrical characteristics, and thermal characteristics over the entire region, thereby preventing occurrence of cracks. This can prevent performance and reliability degradation of the semiconductor module 1.

Comparative Example 2

Figures 10, 11:
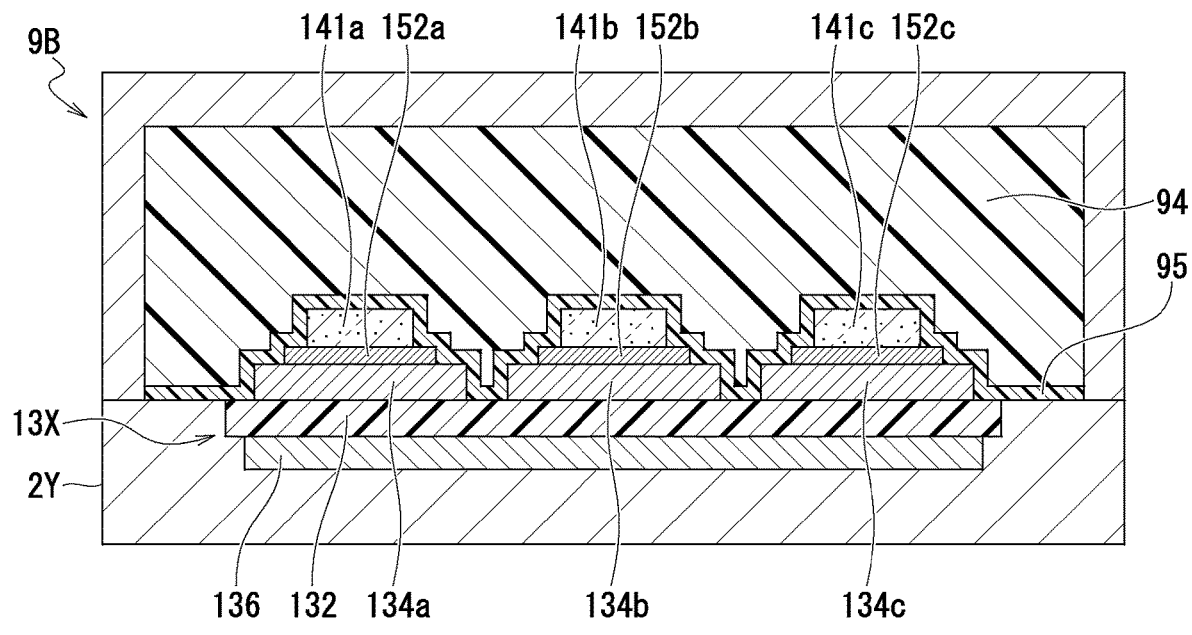
FIG. 10 is a diagram schematically illustrating a step of arranging a sintering material pressurizing and heating mechanism in a method for manufacturing a semiconductor module according to Comparative Example 2.
FIG. 11 is a diagram schematically illustrating a sintering material pressurization and heating step in the method for manufacturing a semiconductor module according to Comparative Example 2.

FIGS. 10 and 11 are diagrams for illustrating a sintering material pressurization and heating step in a method for manufacturing a semiconductor module according to Comparative Example 2. An insulating wiring board, sintering materials, and semiconductor chips for use in a semiconductor module manufactured by the method for manufacturing a semiconductor module according to Comparative Example 2 are described using the same reference signs as the insulating wiring board 13X, the sintering materials 152*a*, 152*b*, and 152*c*, and the semiconductor chips 141*a*, 141*b*, and 141*c* in Comparative Example 1.

As illustrated in FIG. 10, in the method for manufacturing a semiconductor module according to Comparative Example 2, the insulating wiring board 13X is arranged on a lower die 2Y having the same configuration as that of the lower die 2A in the present embodiment. Therefore, when the insulating wiring board 13X is arranged on the lower die 2Y, the conductive patterns 134*a*, 134*b*, and 134*c* included in the insulating wiring board 13X protrude from the lower die 2Y.

Next, as illustrated in FIG. 10, the sintering materials 152*a*, 152*b*, and 152*c* are formed at predetermined locations on the conductive patterns 134*a*, 134*b*, and 134*c*, and the semiconductor chips 141*a*, 141*b*, and 141*c* are arranged on the sintering materials 152*a*, 152*b*, and 152*c*.

Then, as illustrated in FIG. 10, an upper die 9B is arranged to face the lower die 2Y above the lower die 2Y with the insulating wiring board 13X and the like therebetween. The upper die 9B in Comparative Example 2 includes, in a space formed thereinside, the highly fluid elastic body 94 and the sealing sheet 95 that is arranged to close an opening of the space and that seals the elastic body 94 in the space. The upper die 9B is arranged with the sealing sheet 95 facing the lower die 2Y.

Next, as illustrated in FIG. 11, the sintering materials 151*a*, 152*b*, and 152*c* are pressurized by the upper die 9B and the lower die 2Y. When the upper die 9B descends toward the lower die 2Y, the sealing sheet 95 adheres to all surfaces including the semiconductor chips 141*a*, 141*b*, and 141*c*, the sintering materials 151*a*, 151*b*, and 151*c*, and the insulating wiring board 13X. The sealing sheet 95 and the elastic body 94 are more flexible than the semiconductor chips 141*a*, 141*b*, and 141*c* and the insulating wiring board 13X. Therefore, when the upper die 9B is arranged in contact with the lower die 2Y, the sealing sheet 95 and the elastic body 94 near the sealing sheet 95 deform, due to their elasticity, into a shape that follows a shape of the all surfaces including the insulating wiring board 13X and the like. This allows the elastic body 94 to pressurize the sintering materials 152*a*, 152*b*, and 152*c* through the sealing sheet 95.

The upper die 9B and the lower die 2Y are heated and have a temperature of, for example, approximately 250° C., similarly to the upper die 3A and the lower die 2A in the present embodiment. Therefore, the upper die 9B and the lower die 2Y can apply heat as well as pressure to the sintering materials 152*a*, 152*b*, and 152*c*. As a result, the sintering materials 152*a*, 152*b*, and 152*c* are sintered to bond the semiconductor chips 141*a*, 141*b*, and 141*c* and the insulating wiring board 13X (specifically, the conductive patterns 134*a*, 134*b*, and 134*c*) together.

Thus, the upper die 9B in Comparative Example 2 can pressurize and heat the sintering materials 152*a*, 152*b*, and 152*c*. In the method for manufacturing a semiconductor module according to Comparative Example 2, the conductive patterns 134*a*, 134*b*, and 134*c* and the semiconductor chips 141*a*, 141*b*, and 141*c* bite into the elastic body 94 during pressurization and heating onto the sintering materials 152*a*, 152*b*, and 152*c*. As a result, the elastic body 94 tries to spread outward based on sizes of the conductive patterns 134*a* 134*b* and 134*c* and the semiconductor chips 141*a*, 141*b*, and 141*c*. Therefore, the upper die 9B requires to be large enough and strong enough to withstand an internal pressure at which the elastic body 94 tries to spread outward. This leads to expensive fabrication cost of the upper die 9B, increasing manufacturing cost of a semiconductor module.

On the other hand, in the method for manufacturing a semiconductor module according to the present embodiment, the buffer material 7A has a Poisson's ratio of 0.2 or less, as described above. Therefore, the buffer material 7A has a smaller outward spread compared to the elastic body 94 during pressurization and heating onto the sintering materials 151*a*, 151*b*, and 151*c*. This allows the upper die 3A to be less strong than the upper die 9B, so that the upper die 3A may be made of an inexpensive material. Thus, the method for manufacturing a semiconductor module according to the present embodiment can use the upper die 3A that is inexpensive, thereby enabling reduced manufacturing equipment cost and manufacturing cost of a semiconductor module compared to the method for manufacturing a semiconductor module according to Comparative Example 2.

Furthermore, in the method for manufacturing a semiconductor module according to Comparative Example 2, pressure is applied to respective protruding portions of the sintering materials 152*a*, 152*b*, and 152*c* through the elastic body 94. Therefore, in the method for manufacturing a semiconductor module according to Comparative Example 2, sufficient pressure is not applied to the protruding portions, as in the method for manufacturing a semiconductor module according to Comparative Example 1. As a result, a semiconductor module manufactured by the method for manufacturing a semiconductor module according to Comparative Example 2 has a problem with degraded reliability.

In contrast, in the method for manufacturing a semiconductor module according to the present embodiment, the sintered metal layers 15*a*, 15*b*, and 15*c* can have a sintered body with uniform density over the entire region. As a result, the sintered metal layers 15*a*, 15*b*, and 15*c* can have desired mechanical characteristics, electrical characteristics, and thermal characteristics over the entire region, which can prevent performance and reliability degradation of the semiconductor module 1.

As described above, the method for manufacturing a semiconductor module according to the present embodiment incudes arranging the insulating wiring board 13 on the lower die 2A, arranging the sintering material 151*a*, 151*b*, 151*c* at a plurality of locations on the insulating wiring board 13, and the semiconductor chip 14*a*, 14*b*, 14*c* on each of the plurality of sintering materials 151*a*, 151*b*, and 151*c*, arranging the structure 5A above the protruding portions 151*a*-1, 151*b*-1, and 151*c*-1 of the sintering materials 151*a*, 151*b*, and 151*c* protruding from a periphery of each of the plurality of semiconductor chips 14*a*, 14*b*, and 14*c*, and sintering by pressurizing and heating the plurality of the sintering materials 151*a*, 151*b*, and 151*c* by means of the upper die 3A through the structure 5A at the protruding portions 151*a*-1, 151*b*-1, and 151*c*-1 and through the semiconductor chips 14*a*, 14*b*, and 14*c* at the contacting portions 151*a*-2, 151*b*-2, and 151*c*-2 in contact with the lower surfaces of the semiconductor chips 14*a*, 14*b*, and 14*c*.

According to the method for manufacturing a semiconductor module according to the present embodiment, performance and reliability degradation of the semiconductor module 1 can be prevented.

Embodiment 2

Figure 13:
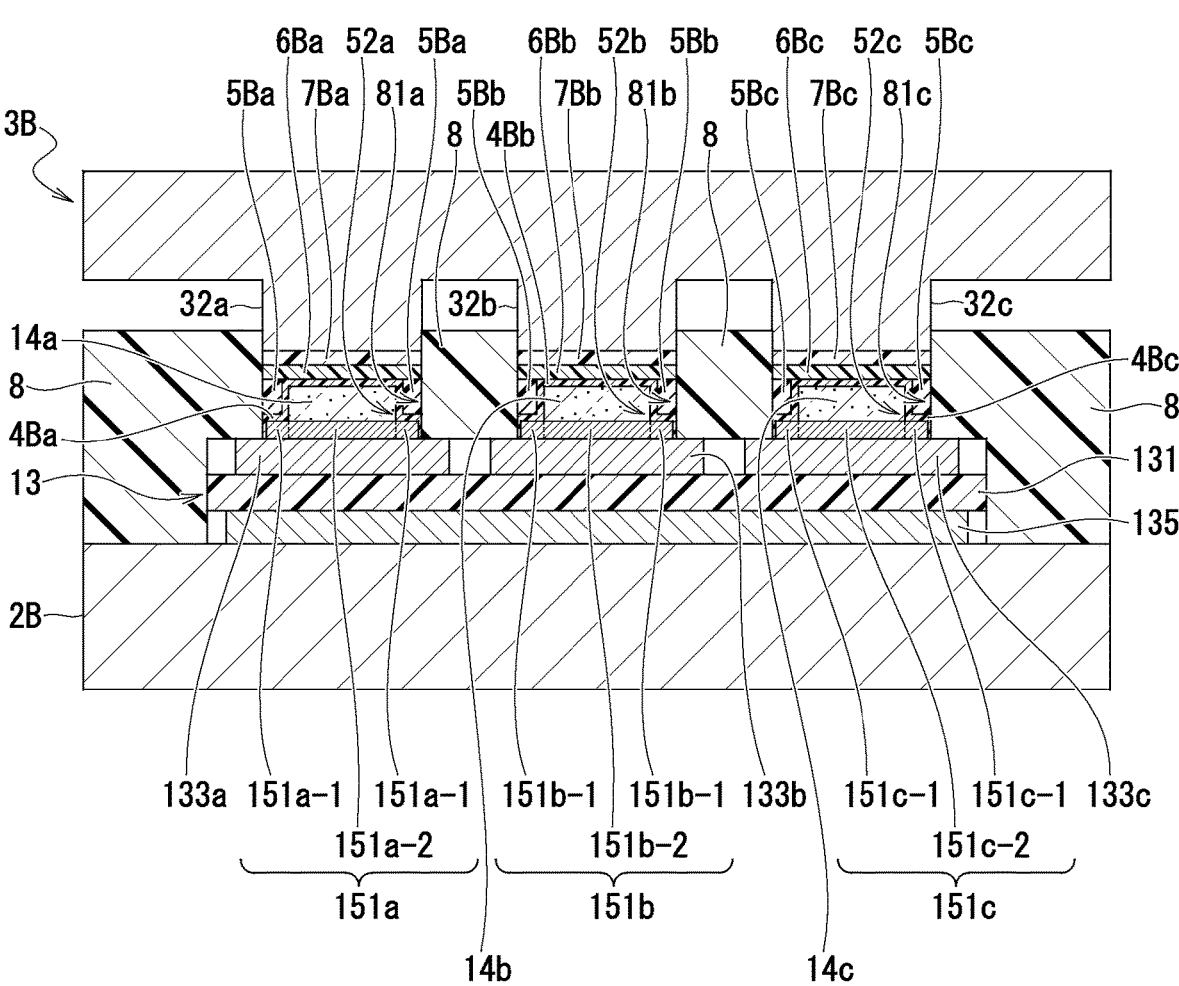
FIG. 13 is a diagram schematically illustrating a sintering material pressurization and heating step in the method for manufacturing a semiconductor module according to Embodiment 2 of the present invention.

A method for manufacturing a semiconductor module according to Embodiment 2 of the present invention is described using FIGS. 12 and 13. The method for manufacturing a semiconductor module according to the present embodiment is characterized by using an upper die including a protrusion at locations corresponding to arrangement positions of a plurality of semiconductor chips. In the description of the method for manufacturing a semiconductor module according to the present embodiment, members that exert the same effects and functions as those of the members used in the above method for manufacturing a semiconductor module according to Embodiment 1 are denoted by the same reference signs, and descriptions thereof are omitted.

Configuration of Semiconductor Module

A semiconductor module manufactured by the method for manufacturing a semiconductor module according to the present embodiment has the same configuration and exerts the same functions as those of a semiconductor module manufactured by the above method for manufacturing a semiconductor module according to Embodiment 1, and therefore a description thereof is omitted.

Method for Manufacturing Semiconductor Module

The method for manufacturing a semiconductor module according to the present embodiment is the same as the above method for manufacturing a semiconductor module according to Embodiment 1 except that a positioning jig arrangement step is included between the insulating wiring board arrangement step and the sintering material and semiconductor chip arrangement step (see FIG. 2) and a positioning jig retreat step is included between the upper die retreat step and the second protection sheet removal step. Therefore, a description of from the positioning jig arrangement step to the sintering material pressurization and heating step (see FIG. 2) is given, and descriptions of the other steps are omitted.

FIG. 12 is a diagram for illustrating a process from a positioning jig arrangement step to a buffer material arrangement step. FIG. 13 is a diagram for illustrating a sintering material pressurization and heating step.

In the positioning jig arrangement step in the method for manufacturing a semiconductor module according to present embodiment, a positioning jig 8 including an opening portion 81a, 81b, 81c at locations corresponding to arrangement positions of the plurality of semiconductor chips 14a, 14b, and 14c is arranged on the insulating wiring board 13 before arranging the plurality of semiconductor chips 14a, 14b, and 14c on the plurality of sintering materials 151a, 151b, and 151c, as illustrated in FIG. 12. This causes the insulating wiring board 13 to be secured to a predetermined location on a lower die 2B having a flat plate shape by the positioning jig 8. The positioning jig 8 is, for example, a carbon or ceramic jig having high heat resistance and low thermal expansion coefficient so as not to deform at temperature applied during sintering of the sintering materials 151a, 151b, and 151c.

In the sintering material and semiconductor chip arrangement step in the present embodiment, the sintering materials 151a, 151b, and 151c are arranged on a plurality of locations on the insulating wiring board 13, and the semiconductor chips 14a, 14b, and 14c are arranged on the plurality of sintering materials 151a, 151b, and 151c, as illustrated in FIG. 12. The sintering material 151a is arranged in an opening portion 81a formed in the positioning jig 8, the sintering material 151b is arranged in an opening portion 81b formed in the positioning jig 8, and the sintering material 151c is arranged in an opening portion 81c formed in the positioning jig 8. The sintering materials 151a, 151b, and 151c arranged on the insulating wiring board 13 are in a paste or sheet form. In the present embodiment, the sintering materials 151a, 151b, and 151c are, for example, in a sheet form large enough to be arranged in the opening portions 81a, 81b, and 81c.

Furthermore, in the sintering material and semiconductor chip arrangement step, the semiconductor chip 14a is arranged on the sintering material 151a, the semiconductor chip 14b is arranged on the sintering material 151b, and the semiconductor chip 14c is arranged on the sintering material 151c. In the present embodiment, the semiconductor chips 14a, 14b, and 14c are arranged on the sintering materials 151a, 151b, and 151c after arranging the sintering materials 151a, 151b, and 151c on the insulating wiring board 13. However, the semiconductor chips 14a, 14b, and 14c provided with the sintering materials 151a, 151b, and 151c may be arranged on the insulating wiring board 13 with the sintering materials 151a, 151b, and 151c side facing the insulating wiring board 13. In this case, a piece of sintering material sheet is punched out by the semiconductor chips 14a, 14b, and 14c, respectively, to provide the sintering materials 151a, 151b, and 151c to the semiconductor chips 14a, 14b, and 14c, respectively.

In addition, the sintering materials 151a, 151b, and 151c may be, for example, in a paste form. In this case, a paste-form sintering material is applied onto each of the opening portions 81a, 81b, and 81c to arrange the sintering materials 151a, 151b, and 151c in paste form in the opening portions 81a, 81b, and 81c.

In a first protection sheet arrangement step in the present embodiment, first protection sheets 4Ba, 4Bb, and 4Bc, respectively, are arranged on the semiconductor chips 14a, 14b, and 14c, as illustrated in FIG. 12. The first protection sheet 4Ba is arranged on the semiconductor chip 14a in the opening portion 81a, the first protection sheet 4Bb is arranged on the semiconductor chip 14b in the opening portion 81b, and the first protection sheet 4Bc is arranged on the semiconductor chip 14c in the opening portion 81c. The first protection sheets 4Ba, 4Bb, and 4Bc are, for example, made of the same material as that of the first protection sheet 4A in Embodiment 1, and are the same in thickness as that thereof. Alternatively, the first protection sheets 4Ba, 4Bb, and 4Bc may be made of a different material from that of the first protection sheet 4A in Embodiment 1, and may be different in thickness from the first protection sheet 4A.

In a structure arrangement step in the present embodiment, structures 5Ba, 5Bb, and 5Bc are arranged above the protruding portions 151a-1, 151b-1, and 151c-1 of the sintering materials 151a, 151b, and 151c protruding from the periphery of each of the plurality of semiconductor chips 14a, 14b, and 14c, as illustrated in FIG. 12. The structures 5Ba, 5Bb, and 5Bc have an annular shape formed to allow insertion of the semiconductor chips 14a, 14b, and 14c, and are arranged above the protruding portions 151a-1, 151b-1, and 151c-1 when arranging spaces 52a, 52b, and 52c surrounded by the structures 5Ba, 5Bb, and 5Bc to correspond to the semiconductor chips 14a, 14b, and 14c. The structure 5Ba is located above the protruding portion 151a-1 of the sintering material 151a with the space 52a corresponding to the semiconductor chip 14a. The structure 5Bb is located above the protruding portion 151b-1 of the sintering material 151b with the space 52b corresponding to the semiconductor chip 14b. The structure 5Bc is located above the protruding portion 151c-1 of the sintering material 151c with the space 52c corresponding to the semiconductor chip 14c. In this way, the structures 5Ba, 5Bb, and 5Bc, respectively, are individually arranged above the plurality of semiconductor chips 14a, 14b, and 14c. The structures 5Ba, 5Bb, and 5Bc are made of, for example, the same material as that of the structure 5A in Embodiment 1. Alternatively, the structures 5Ba, 5Bb, and 5Bc may be made of a different material from that of the structure 5A in Embodiment 1.

In a second protection sheet arrangement step in the present embodiment, second protection sheets 6Ba, 6Bb, and 6Bc are arranged on the structures 5Ba, 5Bb, and 5Bc, as illustrated in FIG. 12. The second protection sheet 6Ba has a membrane shape that can cover, for example, the entire structure 5Ba. The second protection sheet 6Bb has a membrane shape that can cover, for example, the entire structure 5Bb. The second protection sheet 6Bc has a membrane shape that can cover, for example, the entire structure 5Bc. The second protection sheets 6Ba, 6Bb, and 6Bc, for example, are made of the same material as that of the second protection sheet 6A in Embodiment 1 and have the same thickness as that of the second protection sheet 6A. Alternatively, the second protection sheets 6Ba, 6Bb, and 6Bc may be made of a different material from that of the second protection sheet 6A and may be different in thickness from the second protection sheet 6A.

In the buffer material arrangement step in the present embodiment, buffer materials 7Ba, 7Bb, and 7Bc, respectively are individually arranged above the plurality of structures 5Ba, 5Bb, and 5Bc, as illustrated in FIG. 12. The buffer material 7Ba is arranged on the second protection sheet 6Ba in contact with the second protection sheet 6Ba. The buffer material 7Bb is arranged on the second protection sheet 6Bb in contact with the second protection sheet 6Bb. The buffer material 7Bc is arranged on the second protection sheet 6Bc in contact with the second protection sheet 6Bc. Therefore, the buffer material 7Ba is arranged above the semiconductor chip 14a through the second protection sheet 6Ba, the buffer material 7Bb is arranged above the semiconductor chip 14b through the second protection sheet 6Bb, and the buffer material 7Bc is arranged above the semiconductor chip 14c through the second protection sheet 6Bc. Thus, in the present embodiment, the buffer materials 7Ba, 7Bb, and 7Bc are separated from each other.

The buffer materials 7Ba, 7Bb, and 7Bc are made of, for example, the same material as that of the buffer material 7A in Embodiment 1 above. The buffer materials 7Ba, 7Bb, and 7Bc have a heat resistance of 250° C. or higher, a Poisson's ratio of 0.2 or less, a hardness of 80 points ±5% on a type A durometer according to JIS K 6253, and a thickness of from 1.5 mm to 3.0 mm. Since the buffer materials 7Ba, 7Bb, and 7Bc have a hardness of 80 points ±5% on a type A durometer according to JIS K 6253, the buffer materials 7Ba, 7Bb, and 7Bc can be prevented from breaking through the second protection sheets 6Ba, 6Bb, and 6Bc to damage the semiconductor chips 14a, 14b, and 14c during sintering of the sintering materials 151a, 151b, and 151c. Since the buffer materials 7Ba, 7Bb, and 7Bc have a thickness of from 1.5 mm to 3.0 mm, a difference in height (e.g., a difference smaller than 10 μm) between the surfaces of the semiconductor chips 14a, 14b, and 14c facing the buffer materials 7Ba, 7Bb, and 7Bc sides is absorbed, and substantially uniform pressure can be applied to the sintering materials 151a, 151b, and 151c. In addition, the buffer materials 7Ba, 7Bb, and 7Bc have a compressive elastic modulus of 9 MPa at a temperature of 250° C. The buffer materials 7Ba, 7Bb, and 7Bc may be made of a different material from the buffer material 7A as long as the Poisson's ratio, Vickers hardness, and thickness thereof have the above-mentioned values.

In an upper die arrangement step in the present embodiment, an upper die 3B including protrusions 32a, 32b, and 32c at locations corresponding to arrangement positions of the plurality of semiconductor chips 14a, 14b, and 14c is arranged above the lower die 2B so that the plurality of protrusions 32a, 32b, and 32c corresponds to the plurality of semiconductor chips 14a, 14b, and 14c, as illustrated in FIG. 12. Since the buffer materials 7Ba, 7Bb, and 7Bc are located above the semiconductor chips 14a, 14b, and 14c, the upper die 3B is arranged above the lower die 2B with the protrusion 32a facing the buffer material 7Ba, the protrusion 32b facing the buffer material 7Bb, and the protrusion 32c facing the buffer material 7Bc. The upper die 3B is attached to the device for manufacturing a semiconductor module to which the lower die 2B is attached.

The protrusion 32a has a size that allows insertion into the opening portion 81a of the positioning jig 8. The protrusion 32b has a size that allows insertion into the opening portion 81b of the positioning jig 8. The protrusion 32c has a size that allows insertion into the opening portion 81c of the positioning jig 8. Therefore, the upper die 3B can pressurize the sintering materials 151a, 151b, and 151c with the protrusions 32a, 32b, and 32c inserted into the opening portions 81a, 81b, and 81c during sintering of the sintering materials 151a, 151b, and 151c.

The upper die 3B is made of, for example, the same metal material as that of the lower die 2B. The upper die 3B may be made of a different material from that of the lower die 2B. The upper die 3B is heated before being arranged above the lower die 2B in order to apply heat to the sintering materials 151a, 151b, and 151c at a later step, and has a temperature of, for example, 250° C. or higher. Therefore, the protrusions 32a, 32b, and 32c also have a temperature of, for example, 250° C. or higher. The upper die 3B may be attached to the device for manufacturing a semiconductor module after being heated or may be heated by the manufacturing device.

In the sintering material pressurization and heating step in the present embodiment, the plurality of sintering materials 151a, 151b, and 151c is sintered by being pressurized and heated by the upper die 3B through the structures 5Ba, 5Bb, and 5Bc at the sintering material protruding portions 151a-1, 151b-1, and 151c-1 and through the semiconductor chips 14a, 14b, and 14c at the sintering material contacting portions 151a-2, 151b-2, and 151c-2 under the semiconductor chips 14a, 14b, and 14c, as illustrated in FIG. 12. In other words, the plurality of sintering materials 151a, 151b, and 151c is sintered by being pressurized and heated by the protrusions 32a, 32b, and 32c through the plurality of buffer materials 7Ba, 7Bb, and 7Bc, the plurality of semiconductor chips 14a, 14b, and 14c, and the plurality of structures 5Ba, 5Bb, and 5Bc. In the present embodiment, the first protection sheets 4Ba, 4Bb, and 4Bc are arranged between the semiconductor chips 14a, 14b, and 14c and the structures 5Ba, 5Bb, and 5Bc, and the second protection sheets 6Ba, 6Bb, and 6Bc are arranged between the structures 5Ba, 5Bb, and 5Bc and the buffer materials 7Ba, 7Bb, and 7Bc. Accordingly, the upper die 3B pressurizes and heats the sintering materials 151a, 151b, and 151c by means of the protrusions 32a, 32b, and 32c through the semiconductor chips 14a, 14b, and 14c, the first protection sheets 4Ba, 4Bb, and 4Bc, the structures 5Ba, 5Bb, and 5Bc, the second protection sheets 6Ba, 6Bb, and 6Bc, and the buffer materials 7Ba, 7Bb, and 7Bc.

In the sintering material pressurization and heating step in the present embodiment, the lower die 2B supports the insulating substrate 131 from the heat transfer member 135 side with the insulating wiring board 13 secured thereon. Additionally, the lower die 2B has a temperature of, for example, 250° C. or higher. Therefore, in the sintering material pressurization and heating step, the lower die 2B pressurizes and heats the sintering materials 151a, 151b, and 151*c* through the insulating wiring board 13. Thus, the sintering materials 151*a*, 151*b*, and 151*c* are sintered by being subjected to, for example, a pressure of from 10 MPa to 50 MPa and a temperature of from 200° C. to 300° C. by the upper die 3B and the lower die 2B.

The buffer materials 7Ba, 7Bb, and 7Bc are arranged to protrude from the positioning jig 8 before pressurizing the sintering materials 151*a*, 151*b*, and 151*c*. However, as illustrated in FIG. 13, the buffer materials 7Ba, 7Bb, and 7Bc are compressed until an entirety thereof enters the opening portions 81*a*, 81*b*, and 81*c* of the positioning jig 8 when pressurizing and heating the sintering materials 151*a*, 151*b*, and 151*c*.

The buffer materials 7Ba, 7Bb, and 7Bc have low elastic modulus even during the above sintering. Therefore, by being compressed in the step of pressurizing and heating the sintering materials 151*a*, 151*b*, and 151*c*, the buffer materials 7Ba, 7Bb, and 7Bc can absorb height tolerances of each of the surfaces of the semiconductor chips 14*a*, 14*b*, and 14*c* facing the buffer materials 7Ba, 7Bb, and 7Bc side.

Additionally, in the sintering material pressurization and heating step, the buffer materials 7Ba, 7Bb, and 7Bc are subjected to a force in a direction (vertical direction) in which the semiconductor chips 14*a*, 14*b*, and 14*c*, the first protection sheets 4Ba, 4Bb, and 4Bc, the structures 5Ba, 5Bb, and 5Bc, the second protection sheets 6Ba, 6Bb, and 6Bc, and the buffer materials 7Ba, 7Bb, and 7Bc are stacked together. Therefore, the buffer materials 7Ba, 7Bb, and 7Bc apply force with the same strength as the above force in a direction (lateral direction) parallel to an in-plane of the insulating wiring board 13. Around the buffer materials 7Ba, 7Bb, and 7Bc are arranged sidewalls forming the opening portions 81*a*, 81*b*, and 81*c* of the positioning jig 8. Accordingly, in the sintering material pressurization and heating step, the buffer materials 7Ba, 7Bb, and 7Bc apply force to the sidewalls forming the opening portions 81*a*, 81*b*, and 81*c* in a direction pushing and widening the opening portions 81*a*, 81*b*, and 81*c* of the positioning jig 8. Additionally, when the buffer materials 7Ba, 7Bb, and 7Bc push and widen the opening portions 81*a*, 81*b*, and 81*c*, the sidewalls forming those adjacent to each other among the opening portions 81*a*, 81*b*, and 81*c* of the positioning jig 8 exert force on each other. This leads to non-uniform bonding pressurization to each of the semiconductor chips 14*a*, 14*b*, and 14*c*, which may reduce bonding quality between the semiconductor chips 14*a*, 14*b*, and 14*c* and the conductive patterns 133*a*, 133*b*, and 133*c*.

As described above, the buffer materials 7Ba, 7Bb, and 7Bc have a Poisson's ratio of 0.2 or less. Therefore, the buffer materials 7Ba, 7Bb, and 7Bc are characterized by being hard to spread laterally. When pressurized vertically, the buffer materials 7Ba, 7Bb, and 7Bc apply a weaker force to the sidewalls forming the opening portions 81*a*, 81*b*, and 81*c* of the positioning jig 8 than buffer materials made of a material having a Poisson's ratio, for example, greater than 0.2. Thus, since the positioning jig 8 can be fabricated with an inexpensive material having low hardness, the manufacturing cost of the semiconductor module 1 can be reduced.

Applying pressure and heat to the sintering materials 151*a*, 151*b*, and 151*c* by means of the upper die 3B and the lower die 2B promotes sintering reaction in the sintering materials 151*a*, 151*b*, and 151*c*. In a process in which the sintering reaction is promoted, the contacting portion 151*a*-2 of the sintering material 151*a* is subjected to pressure through the semiconductor chip 14*a*, and the protruding portion 151*a*-1 of the sintering material 151*a* is subjected to pressure from the structure 5Ba. A surface of the semiconductor chip 14*a* that is in contact with the first protection sheet 4Ba and a surface of the structure 5Ba that is in contact with the second protection sheet 6Ba and that is above the protruding portion 151*a*-1 have substantially the same height with respect to the surface of the insulating substrate 131 on which the plurality of conductive patterns 133*a*, 133*b*, and 133*c* is formed, although there is a difference by the thickness of the first protection sheet 4Ba. Accordingly, pressure applied to the contacting portion 151*a*-2 of the sintering material 151*a* from the protrusion 32*a* of the upper die 3B through the semiconductor chip 14*a* and pressure applied to the protruding portion 151*a*-1 of the sintering material 151*a* from the protrusion 32*a* through the structure 5B have substantially the same strength. This promotes sintering reaction to the same degree in the contacting portion 151*a*-2 and protruding portion 151*a*-1 of the sintering material 151*a* in the sintering material pressurization and heating step.

Similarly, in the process in which the sintering reaction is promoted, the contacting portion 151*b*-2 of the sintering material 151*b* is subjected to pressure through the semiconductor chip 14*b*, and the protruding portion 151*b*-1 of the sintering material 151*b* is subjected to pressure from the structure 5Bb. A surface of the semiconductor chip 14*b* that is in contact with the first protection sheet 4Bb and a surface of the structure 5Bb that is in contact with the second protection sheet 6Bb and that is above the protruding portion 151*b*-1 have substantially the same height with respect to the surface of the insulating substrate 131 on which the plurality of conductive patterns 133*a*, 133*b*, and 133*c* is formed, although there is a difference by the thickness of the first protection sheet 4Bb. Accordingly, pressure applied to the contacting portion 151*b*-2 of the sintering material 151*b* from the protrusion 32*b* of the upper die 3B through the semiconductor chip 14*b* and pressure applied to the protruding portion 151*b*-1 of the sintering material 151*b* from the protrusion 32*b* through the structure 5Bb have substantially the same strength. This promotes sintering reaction to the same degree in the contacting portion 151*b*-2 and protruding portion 151*b*-1 of the sintering material 151*b* in the sintering material pressurization and heating step.

Similarly, in the process in which the sintering reaction is promoted, the contacting portion 151*c*-2 of the sintering material 151*c* is subjected to pressure through the semiconductor chip 14*c*, and the protruding portion 151*c*-1 of the sintering material 151*c* is subjected to pressure from the structure 5Bc. A surface of the semiconductor chip 14*c* that is in contact with the first protection sheet 4Bc and a surface of the structure 5Bc that is in contact with the second protection sheet 6Bc and that is above the protruding portion 151*c*-1 have substantially the same height with respect to the surface of the insulating substrate 131 on which the plurality of conductive patterns 133*a*, 133*b*, and 133*c* is formed, although there is a difference by the thickness of the first protection sheet 4Bc. Accordingly, pressure applied to the contacting portion 151*c*-2 of the sintering material 151*c* from the protrusion 32*c* of the upper die 3B through the semiconductor chip 14*a* and pressure applied to the protruding portion 151*c*-1 of the sintering material 151*a* from the protrusion 32*c* through the structure 5Bc have substantially the same strength. This promotes sintering reaction to the same degree in the contacting portion 151*c*-2 and protruding portion 151*a*-1 of the sintering material 151*c* in the sintering material pressurization and heating step.

The pressure applied to the protruding portion 151*a*-1 and contacting portion 151*a*-2 of the sintering material 151*a* from the protrusion 32*a* of the upper die 3B through the semiconductor chip 14*a* and the structure 5Ba, the pressure applied to the protruding portion 151*b*-1 and contacting portion 151*b*-2 of the sintering material 151*b* from the protrusion 32*b* of the upper die 3B through the semiconductor chip 14*b* and the structure 5Bb, and the pressure applied to the protruding portion 151*c*-1 and contacting portion 151*c*-2 of the sintering material 151*c* from the protrusion 32*c* of the upper die 3B through the semiconductor chip 14*c* and the structure 5Bc are substantially the same. Accordingly, equivalent and desired sintering reactions are promoted in the protruding portion 151*a*-1 and contacting portion 151*a*-2 of the sintering material 151*a*, the protruding portion 151*b*-1 and contacting portion 151*b*-2 of the sintering material 151*b*, and the protruding portion 151*c*-1 and contacting portion 151*c*-2 of the sintering material 151*c*. This results in formation of the sintered metal layers 15*a*, 15*b*, and 15*c* that have sintered bodies composed by bonding of silver particles or copper particles contained in the sintering materials 151*a*, 151*b*, and 151*c* in a sheet form and that are conductive.

When sintering the sintering materials 151*a*, 151*b*, and 151*c*, the first protection sheets 4Ba, 4Bb, and 4Bc cover upper surfaces and side surfaces of the semiconductor chips 14*a*, 14*b*, and 14*c* and surfaces of the sintering materials 151*a*, 151*b*, and 151*c*. Therefore, the first protection sheets 4Ba, 4Bb, and 4Bc can prevent the upper surfaces and side surfaces of the semiconductor chips 14*a*, 14*b*, and 14*c* from being dirtied by the structures 5Ba, 5Bb, and 5Bc when sintering the sintering materials 151*a*, 151*b*, and 151*c*.

As described above, the method for manufacturing a semiconductor module according to the present embodiment incudes arranging the insulating wiring board 13 on the lower die 2B, arranging the sintering materials 151*a*, 151*b*, and 151*c* at a plurality of locations on the insulating wiring board 13, and the semiconductor chip 14*a*, 14*b*, 14*c* on each of the plurality of sintering materials 151*a*, 151*b*, and 151*c*, arranging the structures 5Ba, 5Bb, and 5Bc above the protruding portions 151*a*-1, 151*b*-1, and 151*c*-1 of the sintering materials 151*a*, 151*b*, and 151*c* protruding from a periphery of each of the plurality of semiconductor chips 14*a*, 14*b*, and 14*c*, and sintering by pressurizing and heating the plurality of the sintering materials 151*a*, 151*b*, and 151*c* by means of the upper die 3B through the structures 5Ba, 5Bb, and 5Bc at the protruding portions 151*a*-1, 151*b*-1, and 151*c*-1 and through the semiconductor chips 14*a*, 14*b*, and 14*c* at the contacting portions 151*a*-2, 151*b*-2, and 151*c*-2 in contact with the lower surfaces of the semiconductor chips 14*a*, 14*b*, and 14*c*.

As a result, according to the method for manufacturing a semiconductor module according to the present embodiment, there can be obtained the same effects as those of the above method for manufacturing a semiconductor module according to Embodiment 1.

Additionally, the method for manufacturing a semiconductor module according to the present embodiment uses the individual structures and buffer materials separated for each of the plurality of semiconductor chips. Therefore, the method for manufacturing a semiconductor module according to the present embodiment is less expensive than the above method for manufacturing a semiconductor module according to Embodiment 1 in terms of the structure and buffer material costs. This allows the method for manufacturing a semiconductor module according to the present embodiment to achieve lower manufacturing cost of a semiconductor module than the above method for manufacturing a semiconductor module according to Embodiment 1.

In addition, with the use of the individual structures and buffer materials separated for each of the plurality of semiconductor chips, an area of the structures in contact with the semiconductor chips and the insulating wiring board is smaller than the corresponding area in the above method for manufacturing a semiconductor module according to Embodiment 1. This allows the method for manufacturing a semiconductor module according to the present embodiment to be easier than the above method for manufacturing a semiconductor according to Embodiment 1 in terms of the steps of removing the structures and the like.

Embodiment 3

Figure 14:
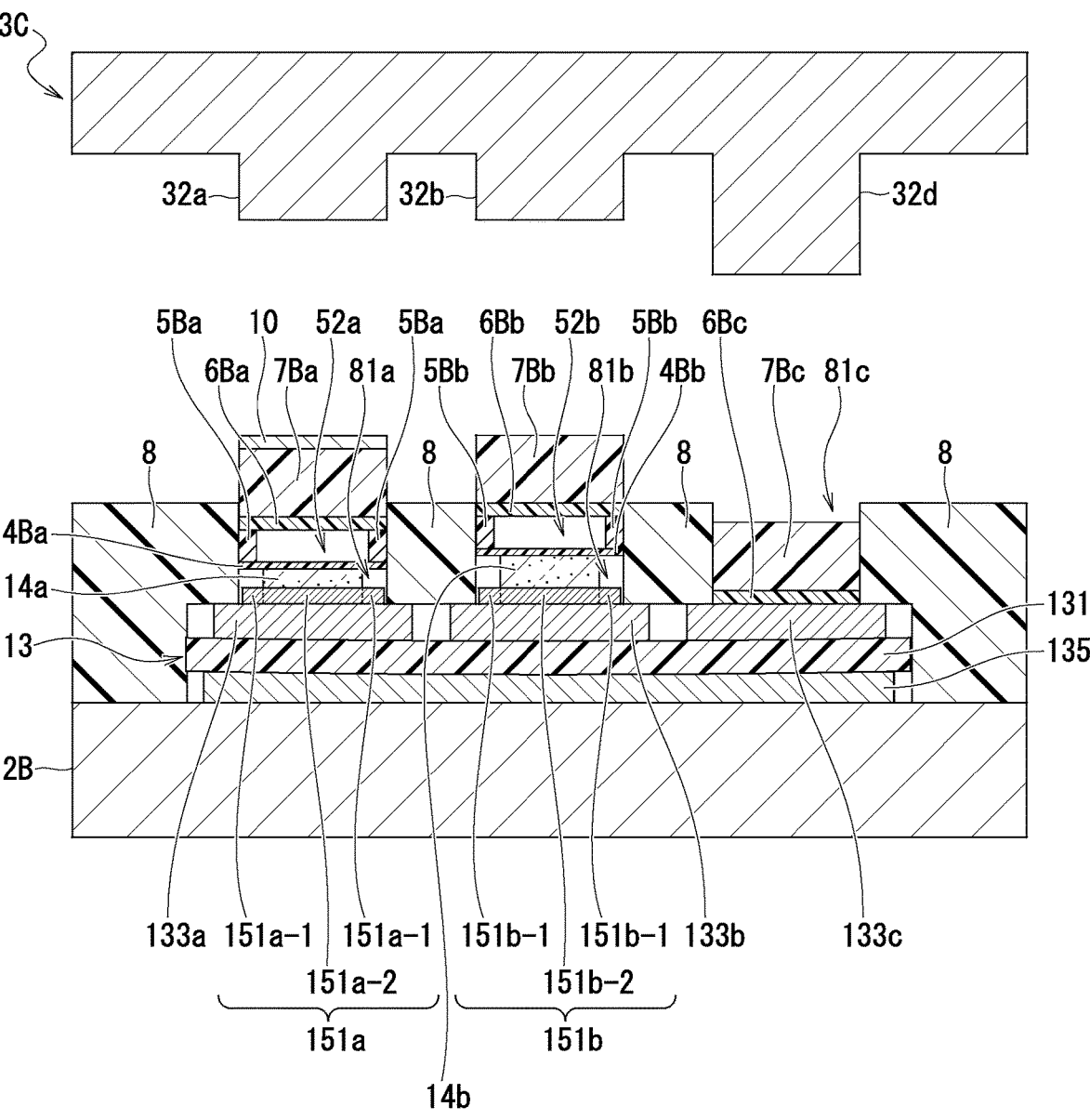
FIG. 14 is a diagram schematically illustrating a structure arrangement step and a spacer member arrangement step in a method for manufacturing a semiconductor module according to Embodiment 3 of the present invention.
Figure 15:
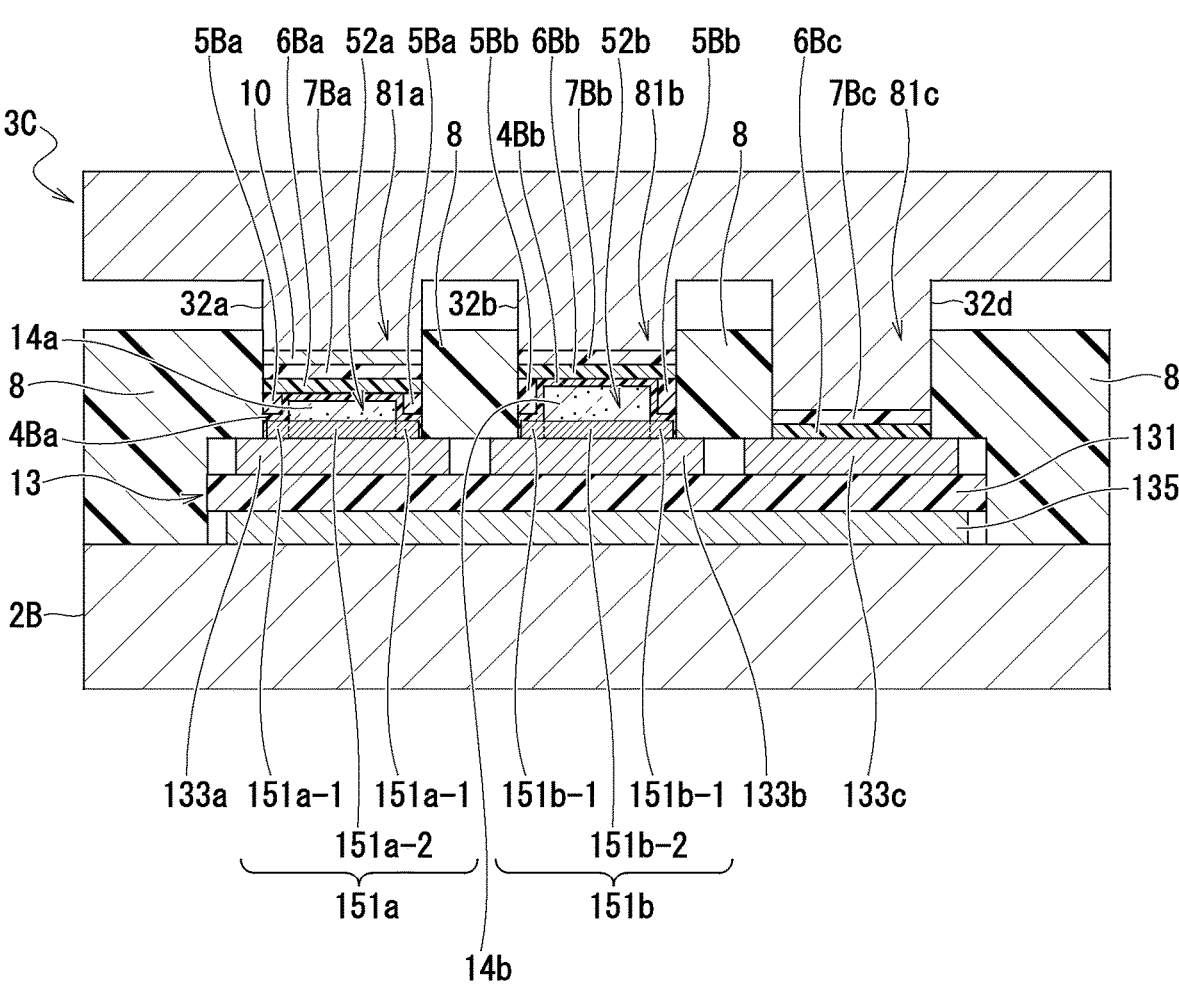
FIG. 15 is a diagram schematically illustrating a sintering material pressurization and heating step in the method for manufacturing a semiconductor module according to Embodiment 3 of the present invention.

A method for manufacturing a semiconductor module according to Embodiment 3 of the present invention is described using FIGS. 14 and 15. The method for manufacturing a semiconductor module according to the present embodiment is characterized by use of a spacer member configured to suppress a stepped difference between a plurality of semiconductor chips and its ability to correct warping that has occurred on an insulating wiring board during sintering of sintering materials. In the description of the method for manufacturing a semiconductor module according to the present embodiment, members that exert the same effects and functions as those of the members used in the above method for manufacturing a semiconductor module according to Embodiment 2 are denoted by the same reference signs, and descriptions thereof are omitted.

(Configuration of Semiconductor Module)

A semiconductor module manufactured by the method for manufacturing a semiconductor module according to the present embodiment has the same configuration and exerts the same functions as a semiconductor module manufactured by the above method for manufacturing a semiconductor module according to Embodiment 1, and therefore a description thereof is omitted.

(Method for Manufacturing Semiconductor Module)

The method for manufacturing a semiconductor module according to the present embodiment is the same as the above method for manufacturing a semiconductor module according to Embodiment 2 except that a spacer member arrangement step is included between the buffer material arrangement step and the upper die arrangement step (see FIG. 2). Therefore, a description of from the spacer member arrangement step to the sintering material pressurization and heating step (see FIG. 2) is given, and descriptions of the other steps are omitted.

FIG. 14 is a diagram illustrating an example of the spacer member arrangement step and the upper die arrangement step. FIG. 15 is a diagram illustrating an example of the sintering material pressurization and heating step. The method for manufacturing a semiconductor module according to the present embodiment is described by exemplifying, for example, a case where the semiconductor chip 14*a* is lower in height than the semiconductor chip 14*b* and the semiconductor chips 14*a* and 14*b* are arranged, but not the semiconductor chip 14*c*.

In the spacer member arrangement step in the present embodiment, it is determined whether heights of surfaces of the semiconductor chips 14*a* and 14*b* in contact with the second protection sheets 6Ba and 6Bb are different or not. As illustrated in FIG. 14, when the heights of the surfaces of the semiconductor chips 14*a* and 14*b* facing the buffer materials 7Ba and 7Bb side are different, a spacer member 10 configured to reduce a difference between the heights is arranged on either of the buffer materials 7Ba and 7Bb (in the present example, the buffer material 7Ba). In the present embodiment, the height of the surface of each semiconductor chip 14a, 14b facing each buffer material 7Ba, 7Bb side is, for example, a distance from the surface of the insulating substrate 132 with each conductive pattern 133a, 133b, and 133c formed thereon. Additionally, in the present embodiment, the surface of the each semiconductor chip 14a, 14b facing the each buffer material 7Ba, 7Bb side is a surface in contact with each second protection sheet 6Ba, 6Bb. Furthermore, in the present embodiment, the difference in height between the surfaces of the semiconductor chips 14a and 14b facing the buffer materials 7Ba and 7Bb side is determined by, for example, a controller (not illustrated) of the device for manufacturing a semiconductor module.

When the difference in height between the surfaces of the semiconductor chips 14a and 14b facing the buffer materials 7Ba and 7Bb side is 10 μm or more, the spacer member 10 is arranged above one of the plurality of semiconductor chips 14a and 14b that is lower in the height. The example illustrated in FIGS. 14 and 15 assumes that the height of the semiconductor chip 14a is, for example, 10 μm or more lower than the height of the semiconductor chip 14b. Therefore, the spacer member 10 is arranged above the semiconductor chip 14a corresponding to the semiconductor chip lower in the height. The spacer member 10 is, for example, a ceramic or metal member that is, for example, lower in thermal expansion coefficient and higher in compressive strength than the buffer materials 7Ba and 7Bb and that is heat-resistant to higher temperatures than temperature applied to the sintering materials 151a and 151b.

Next, at the upper die arrangement step, as illustrated in FIG. 14, an upper die 3C including the protrusions 32a and 32b at predetermined locations corresponding to arrangement positions of the plurality of semiconductor chips 14a and 14b and including a protrusion 32d at a location corresponding to an arrangement position of the conductive pattern 133c is arranged above the lower die 2B so that the protrusions 32a, 32b, and 32d correspond to the semiconductor chips 14a and 14b and the conductive pattern 133c. The protrusions 32a and 32b have the same length as each other. The protrusion 32d is formed longer than the protrusion 32b by a combined thickness of the semiconductor chip 14b and the sintering material 151b. Accordingly, when the upper die 3C is arranged to face the lower die 2B with the insulating wiring board 13 and the like therebetween, the protrusion 32d protrudes more toward the insulating wiring board 13 side than the protrusions 32a and 32b.

In the sintering material pressurization and heating step in the present embodiment, as illustrated in FIG. 15, the plurality of sintering materials 151a and 151b is sintered by being pressurized and heated by the upper die 3C through the structures 5Ba and 5Bb at the sintering material protruding portions 151a-1 and 151b-1 and through the semiconductor chips 14a and 14b at the sintering material contacting portions 151a-2 and 151b-2 under the semiconductor chips 14a and 14b. In other words, the sintering materials 151a and 151b are sintered by being pressurized and heated by the protrusions 32a and 32b through the buffer materials 7Ba and 7Bb, the semiconductor chips 14a and 14b, and the structures 5Ba and 5Bb.

The spacer member 10 has a thickness of, for example, 10 μm or less. Thus, by arranging the spacer member 10, a difference between the height of the semiconductor chip 14a and the height of the semiconductor chip 14b becomes smaller than 10 μm (minimum value: 0). Accordingly, even in the upper die 3C including the protrusions 32a and 32b different in length, the protrusion 32a contacts the spacer member 10 at substantially the same timing as a timing at which the protrusion 32b contacts the buffer material 7Bb. As a result, the upper die 3C can apply substantially the same force as that to the other sintering material 151b, to the sintering material 151a configured to bond the semiconductor chip 14a lower in height to the conductive pattern 133a. The buffer material 7Ba is compressed more than the buffer material 7Bb to an extent that the height of the semiconductor chip 14a is lower than the height of the semiconductor chip 14b. However, the buffer material 7Ba has a Poisson's ratio of 0.2 or less, thus making it hard to spread laterally. Therefore, bonding pressure applied to the semiconductor chip 14a and the structure 5Ba by the buffer material 7Ba and bonding pressure applied to the semiconductor chip 14b and the structure 5Bb by the buffer material 7Bb are substantially uniform.

Additionally, in the sintering material pressurization and heating step in the present embodiment, the conductive pattern 133c is pressurized by the protrusion 32d through the buffer material 7Bc and the second protection sheet 6Bc, as illustrated in FIG. 15. Since the protrusion 32d is formed longer than the protrusion 32b by the combined thickness of the semiconductor chip 14b and the sintering material 151b, the protrusion 32d contacts the buffer material 7Bc at substantially the same timing as a timing at which the protrusion 32b contacts the buffer material 7Bb. The conductive pattern 133a side is pressurized by the protrusion 32a. This corrects warping of the insulating wiring board 13, and makes the insulating wiring board 13 flat.

With the warping of the insulating wiring board 13 corrected, pressure and heat are applied to the sintering materials 151a and 151b by the upper die 3C and the lower die 2B, thereby promoting sintering reactions in the sintering materials 151a and 151b. The effect of the protrusions 32a and 32b on the sintering materials 151a and 151b in the present embodiment is the same as that of the protrusions 32a and 32b on the sintering materials 151a and 151b in Embodiment 2 described above. Therefore, a description thereof is omitted.

Thus, in the present embodiment, pressure applied from the protrusion 32a is applied to the contacting portion 151a-2 and protruding portion 151a-1 of the sintering material 151a through the semiconductor chip 14a and the structure 5Ba, and pressure applied from the protrusion 32b is applied to the contacting portion 151b-2 and protruding portion 151b-1 of the sintering material 151b through the semiconductor chip 14b and the structure 5Bb, as in Embodiment 2 above. Additionally, the pressure applied to the sintering material 151a through the semiconductor chip 14a and the structure 5Ba from the protrusion 32a and the pressure applied to the sintering material 151b through the semiconductor chip 14b and the structure 5Bb from the protrusion 32b are substantially the same. This promotes equivalent and desired sintering reactions in the protruding portion 151a-1 and contacting portion 151a-2 of the sintering material 151a and the protruding portion 151b-1 and contacting portion 151b-2 of the sintering material 151b. As a result, the sintered metal layers 15a and 15b are formed that have sintered bodies composed by bonding of silver particles or copper particles contained in the sintering materials 151a and 151b in a sheet form and that are conductive.

As described above, the method for manufacturing a semiconductor module according to the present embodiment includes arranging the insulating wiring board 13 on the lower die 2B, arranging the sintering material 151a, 151b at a plurality of locations on the insulating wiring board 13, and the semiconductor chip 14a, 14b on each of the plurality of sintering materials 151*a* and 151*b*, arranging the structures 5Ba and 5Bb above the protruding portions 151*a*-1 and 151*b*-1 of the sintering materials 151*a* and 151*b* protruding from the periphery of each of the plurality of semiconductor chips 14*a* and 14*b*, and sintering by pressurizing and heating the plurality of sintering materials 151*a* and 151*b* by means of the upper die 3C through the structures 5Ba and 5Bb at the protruding portions 151*a*-1 and 151*b*-1 and through the semiconductor chips 14*a* and 14*b* at the contacting portions 151*a*-2 and 151*b*-2 in contact with the lower surfaces of the semiconductor chips 14*a* and 14*b*.

Thus, according to the method for manufacturing a semiconductor module according to the present embodiment, there can be obtained the same effects as those of the above method for manufacturing a semiconductor module according to Embodiment 1.

In addition, in the method for manufacturing a semiconductor module according to the present embodiment, when the heights of the surfaces of the semiconductor chips 14*a* and 14*b* facing the buffer materials 7Ba and 7Bb side are different, the spacer member 10 configured to reduce a difference between the heights is arranged on either of the buffer materials 7Ba and 7Bb (in the present example, the buffer material 7Ba). This reduces the difference in height between the semiconductor chips 14*a* and 14*b*, enabling substantially the same pressure to be applied to the sintering materials 151*a* and 151*b* from the upper die 3C. Thus, the method for manufacturing a semiconductor module according to the present embodiment can prevent performance and reliability degradation of a semiconductor module even when a plurality of semiconductor chips different in thickness is used together.

Furthermore, the method for manufacturing a semiconductor module according to the present embodiment can sinter the sintering materials 151*a* and 151*b* with warping of the insulating wiring board 13 corrected. Thus, in the sintering material pressurization and heating step, the method for manufacturing a semiconductor module according to the present embodiment can forcibly flatten the insulating wiring board 13 deformed, and can sinter the sintering materials 151*a* and 151*b*.

The present invention is not limited to Embodiments 1 to 3 described above, and can be modified in various ways.

In Embodiments 1 to 3 above, the semiconductor modules 1 are characterized in that the semiconductor chips 14*a*, 14*b*, and 14*c* or 14*a* and 14*b* and the conductive patterns 133*a*, 133*b*, and 133*c* are connected to the terminals 16*a*, 16*b*, and the like provided on the case 11 by bonding wires 17*a*, 17*b*, and the like. However, the present invention is not limited thereto. For example, a semiconductor module manufactured by the method for manufacturing a semiconductor module according to the present invention may have an implant-pin structure using an implant-pin substrate with pins bonded on main surfaces of semiconductor chips to form electrical wiring. Alternatively, for example, a semiconductor module manufactured by the method for manufacturing a semiconductor module according to the present invention may have a lead frame wiring structure.

Although the above methods for manufacturing a semiconductor module according to Embodiments 2 and 3 use the positioning jig 8, the present invention is not limited thereto. The buffer materials 7Ba, 7Bb, and 7Bc have a Poisson's ratio of 0.2 or less, and are hard to spread laterally during pressurization and heating onto the sintering materials 151*a*, 151*b*, and 151*c*, so that lateral pressure distribution is unlikely to occur. Therefore, there is no need to suppress lateral spread of the buffer materials 7Ba, 7Bb, and 7Bc by the positioning jig 8, and thus no positioning jig has to be used.

The technological scope of the present invention is not limited to the exemplary embodiments illustrated and described, but also includes all embodiments that produce effects equivalent to those for which the present invention is intended. Furthermore, the technological scope of the present invention is not limited to combinations of features of the present invention defined by the claims, but may be defined by any desired combination of specific features out of all respective features disclosed.

REFERENCE SIGNS LIST

1: Semiconductor module
2, 2A, 2B, 2X, 2Y: Lower die
3A, 3B, 3C, 3X: Upper die
4A, 4Ba, 4Bb, 4Bc: First protection sheet
5A, 5B, 5Ba, 5Bb, 5Bc: Structure
6A, 6Ba, 6Bb, 6Bc: Second protection sheet
6X: Protection sheet
7A, 7Ba, 7Bb, 7Bc: Buffer material
8: Positioning jig
9A, 9B, 9X: Upper die
10: Spacer member
11: Case
13, 13X: Insulating wiring board
14*a*, 14*b*, 14*c*, 141*a*, 141*b*, 141*c*: Semiconductor chip
15*a*, 15*b*, 15*c*: Sintered metal layer
16*a*, 16*b*: Terminal
17*a*, 17*b*, 17*c*, 17*d*, 17*e*, 17*f*: Bonding wire
18: Sealing resin
19: Cooler
21: Recessed portion
31: Space
32*a*, 32*b*, 32*c*, 32*d*: Protrusion
51*a*, 51*b*, 51*c*: Through hole
52*a*, 52*b*, 52*c*, 111: Space
81*a*, 81*b*, 81*c*: Opening portion
91: Pressurization mechanism
92*a*, 92*b*, 92*c*: Individual pressurization portion
94: Elastic body
95: Sealing sheet
131, 132: Insulating substrate
133*a*, 133*b*, 133*c*, 134*a*, 134*b*, 134*c*: Conductive pattern
135, 136: Heat transfer member
151*a*, 151*b*, 151*c*, 152*a*, 152*b*, 152*c*: Sintering material
151*a*-1, 151*b*-1, 151*c*-1, 152*a*-1: Protruding portion
151*a*-2, 151*b*-2, 151*c*-2, 152*a*-2: Contacting portion
SC1, SC2, SC3: Sintered body

The invention claimed is:
1. A method for manufacturing a semiconductor module comprising:
arranging an insulating wiring board on a lower die;
arranging a sintering material at a plurality of locations on the insulating wiring board and arranging a semiconductor chip on each of the plurality of sintering materials;
arranging a structure above protruding portions of the sintering materials protruding from a periphery of each of the plurality of semiconductor chips; and
sintering by pressurizing and heating the plurality of sintering materials by means of an upper die through the structure at the protruding portions of the sintering materials and through the semiconductor chips at portions of the sintering materials under the semiconductor chips.

2. The method for manufacturing a semiconductor module according to claim 1, wherein the structure is in a sheet form including through holes formed to allow insertion of the semiconductor chips at locations corresponding to each of the plurality of semiconductor chips, peripheral portions of the through holes being located above the protruding portions when the through holes are arranged to correspond to the semiconductor chips.

3. The method for manufacturing a semiconductor module according to claim 2, wherein a single buffer material is arranged above the structure, in which with the plurality of sintering materials, the plurality of semiconductor chips, the structure, and the buffer material contained in a space formed in the upper die, the plurality of sintering materials is sintered by being pressurized and heated by the upper die through the buffer material, the plurality of semiconductor chips, and the structure.

4. The method for manufacturing a semiconductor module according to claim 3, wherein the buffer material has a heat resistance of 250° C. or higher, a Poisson's ratio of 0.2 or less, and a hardness of 80 points ±5% on a type A durometer according to JIS K 6253.

5. The method for manufacturing a semiconductor module according to claim 1, wherein the structure includes an annular shape formed to allow insertion of the semiconductor chips, and is arranged above the protruding portions when a space surrounded by the structure is arranged to correspond to the semiconductor chips.

6. The method for manufacturing a semiconductor module according to claim 5, wherein the structure is arranged individually above each of the plurality of semiconductor chips;

a buffer material is arranged individually above the plurality of structures;

the upper die including a protrusion at locations corresponding to arrangement positions of the plurality of semiconductor chips is arranged above the lower die so that the plurality of protrusions correspond to the plurality of semiconductor chips; and the plurality of sintering materials is sintered by being pressurized and heated by the protrusions through the plurality of buffer materials, the plurality of semiconductor chips, and the structure.

7. The method for manufacturing a semiconductor module according to claim 6, wherein the buffer materials have a heat resistance of 250° C. or higher, a Poisson's ratio of 0.2 or less, a hardness of 80 points ±5% on a type A durometer according to JIS K 6253, and a thickness of 1.5 mm or more.

8. The method for manufacturing a semiconductor module according to claim 6, wherein heights of surfaces of the plurality of semiconductor chips facing a side of the buffer materials are different, a spacer member configured to reduce a difference between the heights is arranged on any of the buffer materials.

9. The method for manufacturing a semiconductor module according to claim 8, wherein the difference between the heights is 10 μm or more, the spacer member is arranged above any of the plurality of semiconductor chips that is lower in the height.

10. The method for manufacturing a semiconductor module according to claim 5, wherein, before arranging the plurality of semiconductor chips on the plurality of sintering materials, a positioning jig including an opening portion at locations corresponding to arrangement positions of the plurality of semiconductor chips is arranged on the insulating wiring board.

11. The method for manufacturing a semiconductor module according to claim 1, wherein the sintering materials are in a paste or sheet form.

12. The method for manufacturing a semiconductor module according to claim 2, wherein the sintering materials are in a paste or sheet form.

13. The method for manufacturing a semiconductor module according to claim 3, wherein the sintering materials are in a paste or sheet form.

14. The method for manufacturing a semiconductor module according to claim 4, wherein the sintering materials are in a paste or sheet form.

15. The method for manufacturing a semiconductor module according to claim 5, wherein the sintering materials are in a paste or sheet form.

16. The method for manufacturing a semiconductor module according to claim 6, wherein the sintering materials are in a paste or sheet form.

17. The method for manufacturing a semiconductor module according to claim 7, wherein the sintering materials are in a paste or sheet form.

18. The method for manufacturing a semiconductor module according to claim 8, wherein the sintering materials are in a paste or sheet form.

19. The method for manufacturing a semiconductor module according to claim 9, wherein the sintering materials are in a paste or sheet form.

20. The method for manufacturing a semiconductor module according to claim 10, wherein the sintering materials are in a paste or sheet form.

21. The method of claim 1 further comprising:

arranging a protection sheet above the protruding portions of the sintering materials protruding from the periphery of each of the plurality of semiconductor chips; and arranging the structure above the protection sheet.

\* \* \* \* \*